(12) United States Patent
Ito et al.

(10) Patent No.: US 11,284,503 B2
(45) Date of Patent: Mar. 22, 2022

(54) WIRING CIRCUIT BOARD, PRODUCING METHOD THEREOF, AND WIRING CIRCUIT SHEET

(71) Applicant: NITTO DENKO CORPORATION, Osaka (JP)

(72) Inventors: Masaki Ito, Osaka (JP); Naoki Shibata, Osaka (JP); Yasunari Oyabu, Osaka (JP); Kenya Takimoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/057,912

(22) PCT Filed: May 10, 2019

(86) PCT No.: PCT/JP2019/018714
§ 371 (c)(1),
(2) Date: Nov. 23, 2020

(87) PCT Pub. No.: WO2019/230335
PCT Pub. Date: Dec. 5, 2019

(65) Prior Publication Data
US 2021/0212196 A1 Jul. 8, 2021

(30) Foreign Application Priority Data
May 31, 2018 (JP) .............................. JP2018-104707

(51) Int. Cl.
*H05K 1/00* (2006.01)
*H05K 1/02* (2006.01)
(Continued)

(52) U.S. Cl.
CPC ............. *H05K 1/0209* (2013.01); *H05K 3/44* (2013.01); *H05K 1/056* (2013.01); *H05K 3/10* (2013.01);
(Continued)

(58) Field of Classification Search
CPC .. H05K 1/00; H05K 1/02; H05K 1/09; H05K 1/11; H05K 1/18; H05K 1/111;
(Continued)

(56) References Cited

U.S. PATENT DOCUMENTS 8,254,144 B2 * 8/2012 Matsumoto .......... H05K 1/0224
361/803
9,986,640 B2 * 5/2018 Yang ................... H01F 17/0013
(Continued)

FOREIGN PATENT DOCUMENTS

JP S55-140255 A 11/1980
JP H06-125155 A 5/1994
(Continued)

OTHER PUBLICATIONS

Office Action, issued by the Japanese Patent Office dated Oct. 26, 2021, in connection with Japanese Patent Application No. 2018-104707.
(Continued)

*Primary Examiner* — Xiaoliang Chen
(74) *Attorney, Agent, or Firm* — Edwards Neils LLC; Jean C. Edwards, Esq.

(57) ABSTRACT

A wiring circuit board includes a support metal layer having thermal conductivity of 5 W/m·K or more, an insulating layer disposed on at least one side in a thickness direction of the support metal layer, a wiring layer disposed on a front surface of the insulating layer, a protective metal film disposed on the entire surface of the support metal layer between the support metal layer and the insulating layer, and
(Continued)

a protective thin film disposed on an exposed surface exposed from the protective metal film in the support metal layer.

5 Claims, 11 Drawing Sheets

(51) Int. Cl.
| | |
|---|---|
| H05K 1/09 | (2006.01) |
| H05K 1/11 | (2006.01) |
| H05K 1/18 | (2006.01) |
| H05K 3/20 | (2006.01) |
| H05K 3/28 | (2006.01) |
| H05K 3/38 | (2006.01) |
| H05K 3/44 | (2006.01) |
| H05K 7/00 | (2006.01) |
| H05K 7/20 | (2006.01) |
| H05K 1/05 | (2006.01) |
| H05K 3/10 | (2006.01) |

(52) U.S. Cl.
CPC ............... H05K 2201/0317 (2013.01); H05K 2203/072 (2013.01)

(58) Field of Classification Search
CPC .......... H05K 1/115; H05K 1/181; H05K 3/20; H05K 3/28; H05K 3/38; H05K 3/44; H05K 7/00; H05K 7/20
USPC ........ 174/252, 251, 255, 256, 257; 361/700, 361/704, 708, 709, 710, 717
See application file for complete search history.

(56) References Cited

U.S. PATENT DOCUMENTS

| | | | | |
|---|---|---|---|---|
| 2006/0145805 | A1* | 7/2006 | Kim | H01F 5/00 336/200 |
| 2006/0180344 | A1* | 8/2006 | Ito | H05K 3/4602 174/262 |
| 2006/0191133 | A1* | 8/2006 | Nakao | H05K 3/4617 29/831 |
| 2011/0083883 | A1* | 4/2011 | Yugawa | H05K 3/388 174/256 |
| 2011/0100691 | A1* | 5/2011 | Yugawa | H05K 3/388 174/260 |
| 2012/0306608 | A1* | 12/2012 | Takenaka | H05K 3/30 336/200 |
| 2013/0074321 | A1* | 3/2013 | Yoon | H01F 41/041 29/602.1 |
| 2013/0223033 | A1* | 8/2013 | Mano | H05K 1/18 361/763 |
| 2013/0342301 | A1* | 12/2013 | Mano | H01F 27/24 336/200 |
| 2014/0034373 | A1* | 2/2014 | Yoshikawa | H05K 1/165 174/260 |
| 2015/0077209 | A1* | 3/2015 | Fujii | C25D 5/10 336/200 |
| 2015/0116950 | A1* | 4/2015 | Yoo | H05K 1/185 361/728 |
| 2016/0236402 | A1* | 8/2016 | Nakashima | H05K 3/4644 |
| 2018/0295451 | A1* | 10/2018 | Min | H05K 3/4614 |
| 2020/0395803 | A1* | 12/2020 | Ito | H02K 41/031 |

FOREIGN PATENT DOCUMENTS

| | | |
|---|---|---|
| JP | 8-125295 A | 5/1996 |
| JP | 2003-152335 A | 5/2003 |
| JP | 2004-214583 A | 7/2004 |
| JP | 2007-035868 A | 2/2007 |
| JP | 2014-191845 A | 10/2014 |

OTHER PUBLICATIONS

International Preliminary Report on Patentability issued by WIPO dated Dec. 1, 2020, in connection with International Patent Application No. PCT/JP2019/018714.

International Search Report Issued in PCT/JP2019/018714 dated Jul. 30, 2019.

Written Opinion Issued in PCT/JP2019/018714 dated Jul. 30, 2019.

Office Action, issued by the Japanese Patent Office dated Dec. 14, 2021, in connection with Japanese Patent Application No. 2018-104707.

* cited by examiner

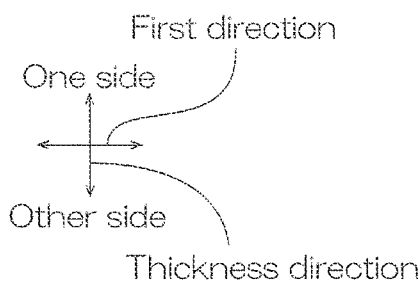
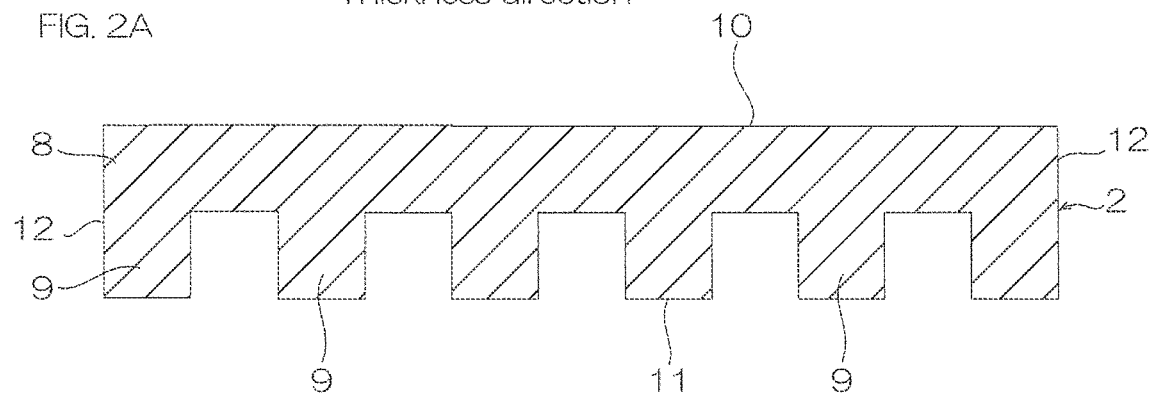
FIG. 2A
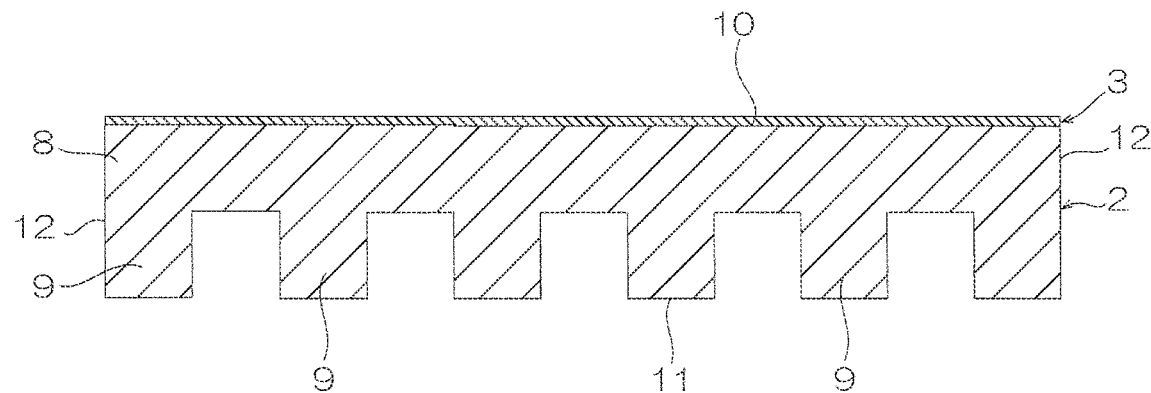
FIG. 2B
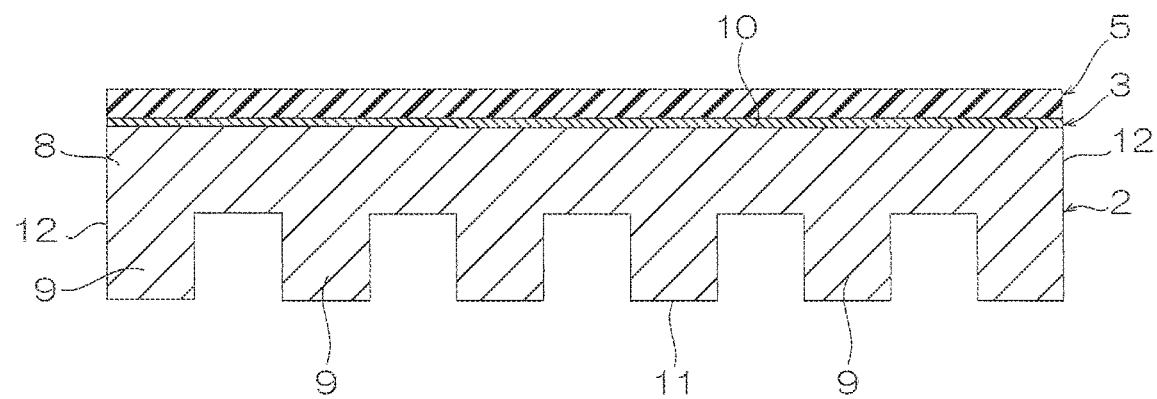
FIG. 2C

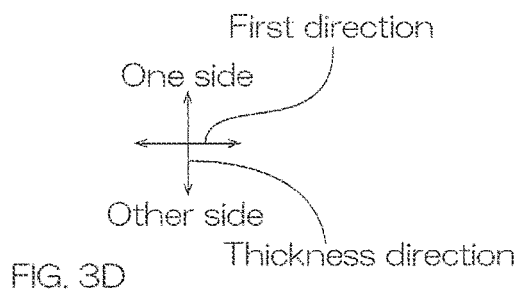
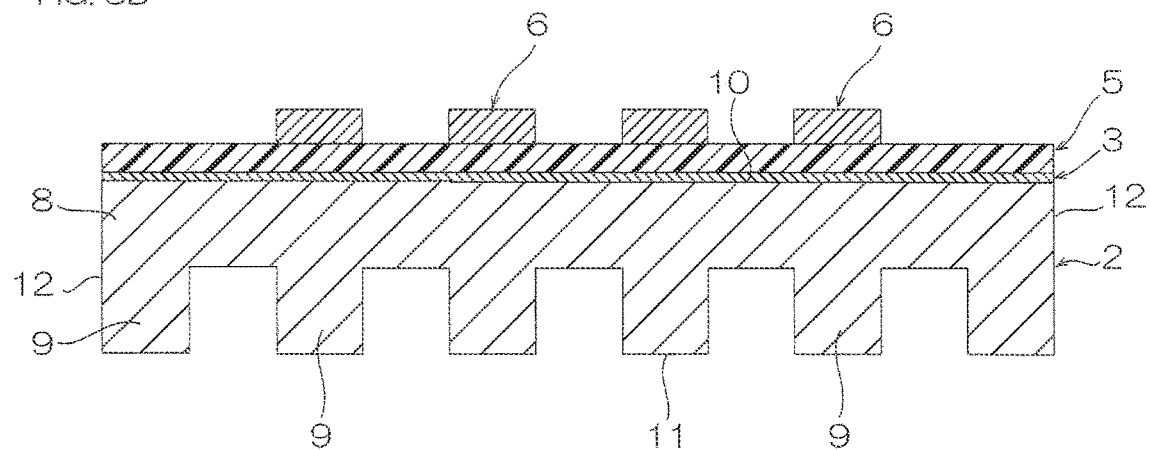
FIG. 3D
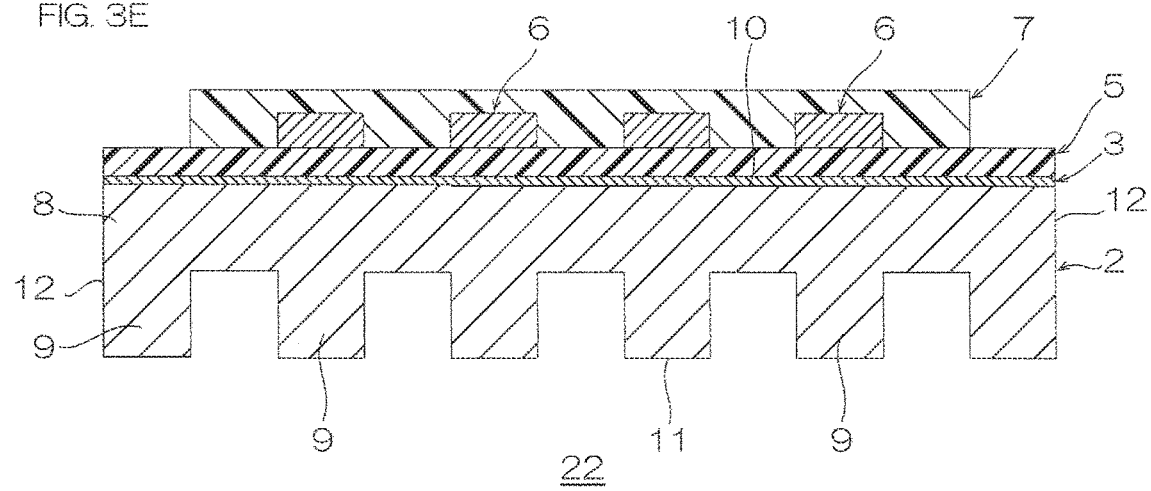
FIG. 3E
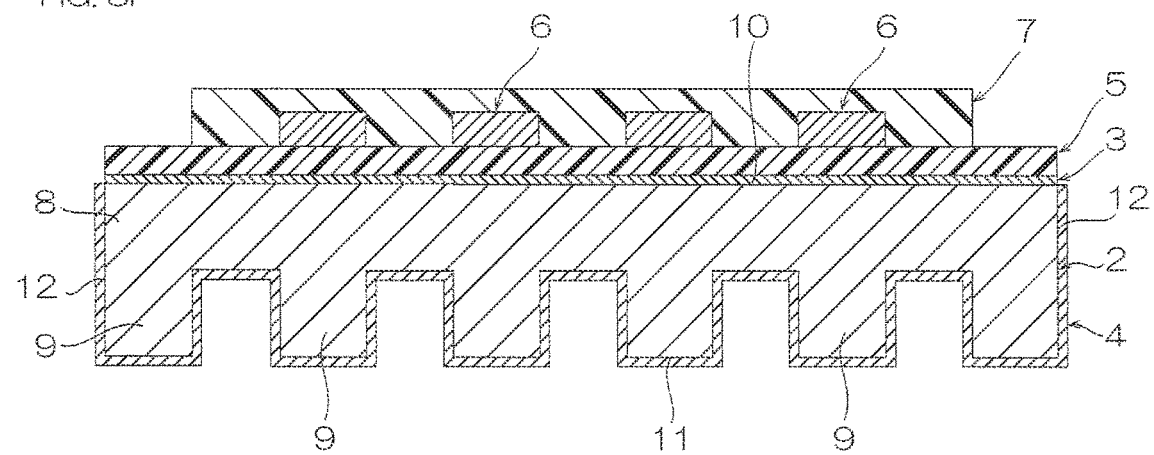
FIG. 3F

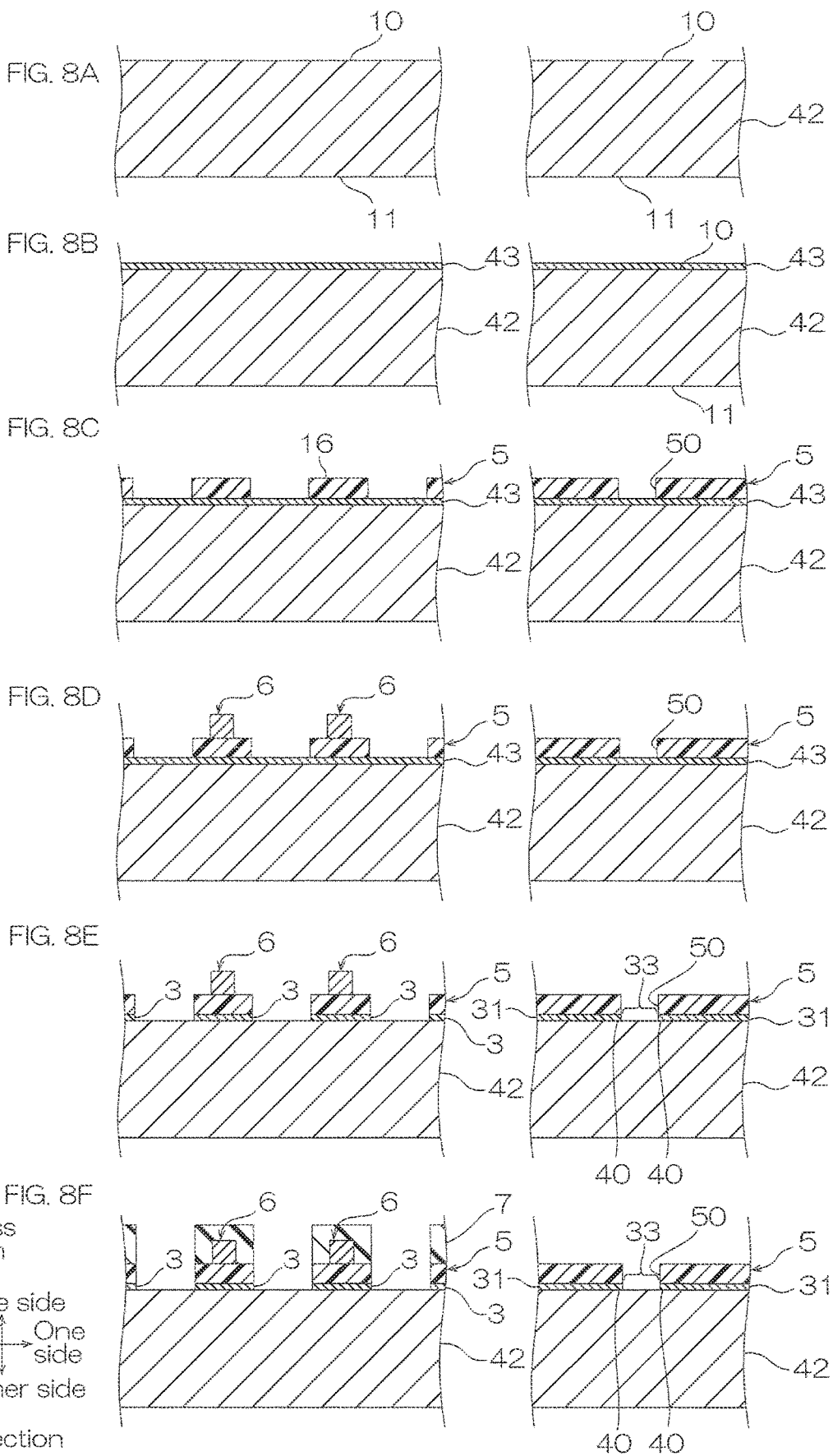

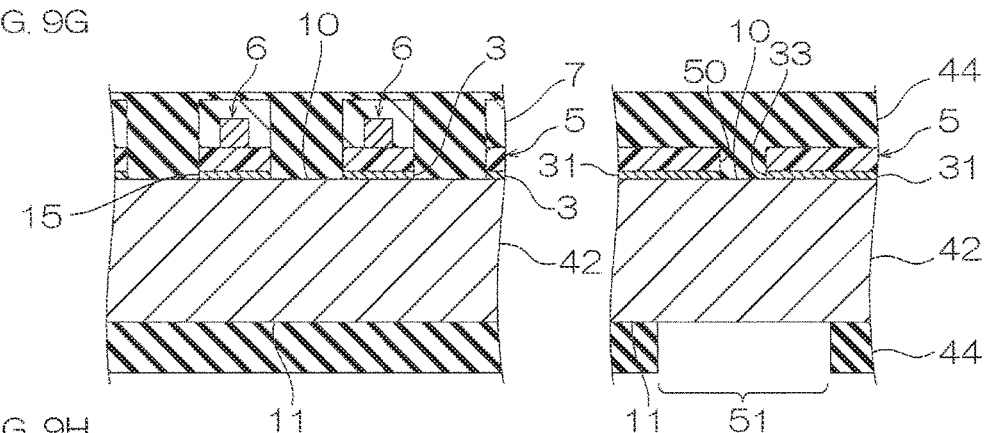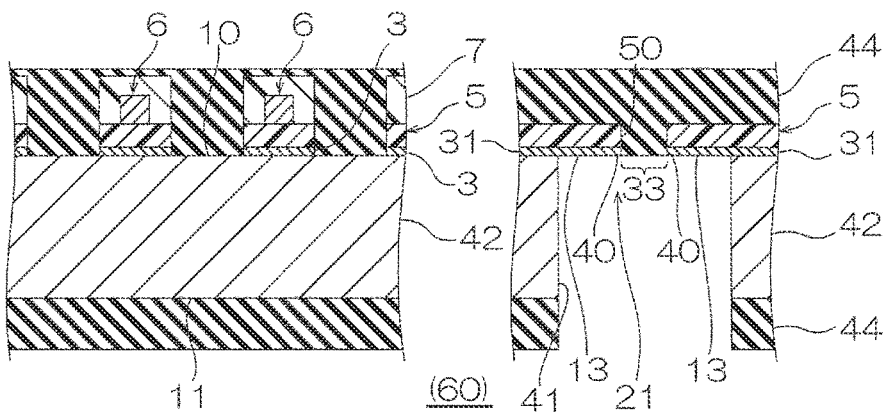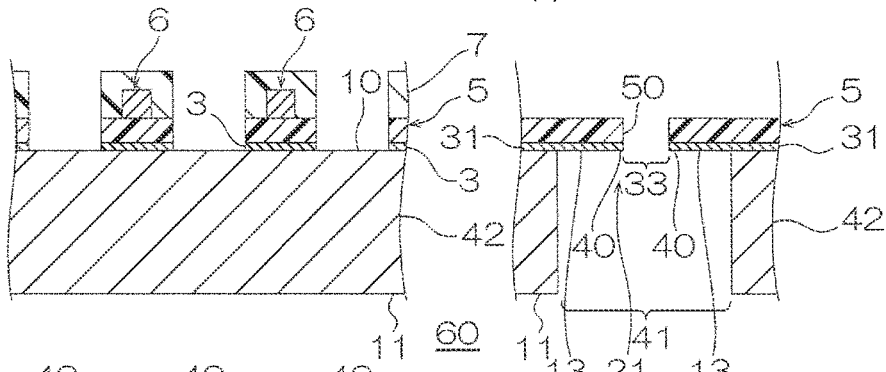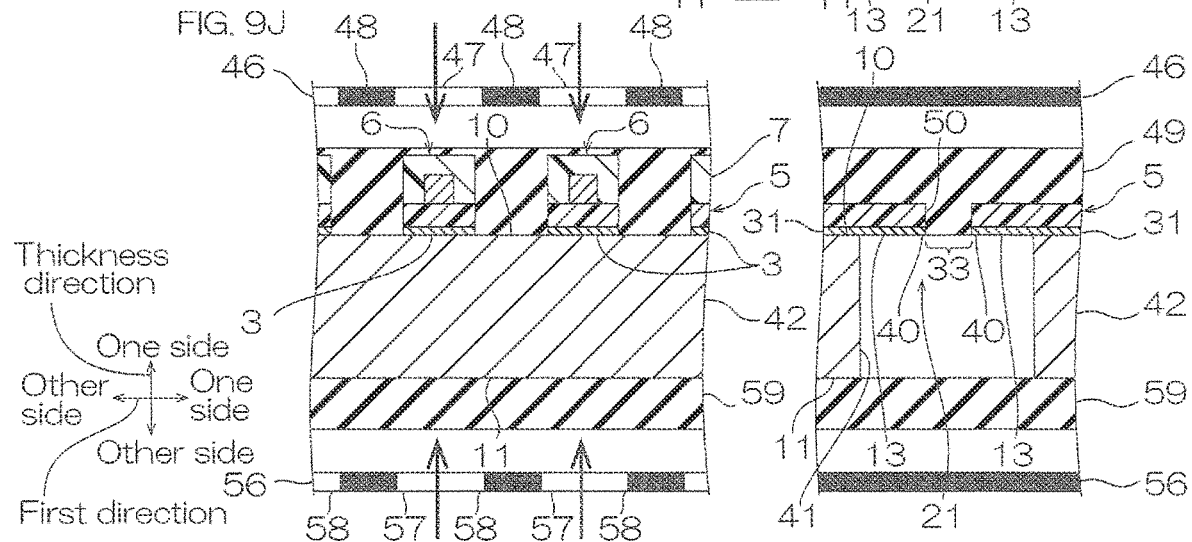

WIRING CIRCUIT BOARD, PRODUCING METHOD THEREOF, AND WIRING CIRCUIT SHEET

CROSS-REFERENCE TO RELATED APPLICATIONS

The present application is a 35 U.S.C. 371 National Stage Entry PCT/JP2019/018714, filed on May 10, 2019, which claims priority from Japanese Patent Application No. 2018-104707, filed on May 31, 2018, the contents of all of which are herein incorporated by reference in their entirety.

TECHNICAL FIELD

The present invention relates to a wiring circuit board, a method for producing a wiring circuit board, and a wiring circuit sheet.

BACKGROUND ART

Conventionally, a heat dissipation structure has been known in which a substrate made of a resin is disposed on the upper surface of a base portion of a heat sink made of a metal and including a flat-shaped base portion and a comb-shaped fin extending from the lower surface of the base portion downwardly, and a heating element is provided on the upper surface of the substrate (ref: for example, Patent Document 1 below).

CITATION LIST

Patent Document

Patent Document 1: Japanese Unexamined Patent Publication No. S55-140255

SUMMARY OF THE INVENTION

Problem to be Solved by the Invention

However, high corrosion resistance (rust prevention) is required for the heat sink. Therefore, it is tentatively considered that a rust preventive layer is formed on the lower surface and the side surface of the heat sink by a wet process.

However, a minute gap is easily formed between the peripheral end edge of the upper surface of the base portion of the heat sink and the peripheral end edge of the lower surface of the substrate. Then, when the rust preventive layer is formed by the wet process, a liquid containing a rust preventive component cannot sufficiently enter the gap described above, and therefore, the rust preventive layer is not formed in the peripheral end edge of the upper surface of the base portion facing the gap to remain exposed. Therefore, there is a problem that the peripheral end edge described above of the heat sink is corroded (rust).

The present invention provides a wiring circuit board having a support metal layer having excellent corrosion resistance, a method for producing a wiring circuit board, and a wiring circuit sheet for producing a wiring circuit board.

Means for Solving the Problem

The present invention (1) includes a wiring circuit board including a support metal layer having thermal conductivity of 5 W/m·K or more, an insulating layer disposed at at least one side in a thickness direction of the support metal layer, a wiring layer disposed on a front surface of the insulating layer, a protective metal film disposed on the entire surface of the support metal layer between the support metal layer and the insulating layer, and a protective thin film disposed on an exposed surface exposed from the protective metal film in the support metal layer.

In the wiring circuit board, the protective metal film is disposed on the surface of the support metal layer between the support metal layer and the insulating layer. Therefore, when the protective thin film is formed by the wet process, it is possible to prevent the exposure of the peripheral end edge of the surface of the support metal layer due to the fact that a liquid does not enter the gap described in the above-described "PROBLEM TO BE SOLVED BY THE INVENTION", and as a result, it is possible to suppress the corrosion described above. Furthermore, the protective thin film is also disposed on the exposed surface exposed from the protective metal film in the support metal layer.

Therefore, the support metal layer is excellent in corrosion resistance.

The present invention (2) includes the wiring circuit board described in (1) including a plurality of wiring bodies disposed in parallel at spaced intervals to each other, wherein each of the plurality of wiring bodies includes the support metal layer, the insulating layer, the wiring layer, the protective metal film, and the protective thin film.

The support metal layer in the wiring body of the wiring circuit board is excellent in corrosion resistance.

Furthermore, in the wiring circuit board, since the wiring bodies are disposed in parallel at spaced intervals to each other, it is possible to achieve efficient heat dissipation by convecting the heat generated in the wiring layer through the air between the plurality of wiring bodies.

The present invention (3) includes the wiring circuit board described in (1) or (2), wherein the protective thin film is a plating film.

In the wiring circuit board, when the protective thin film is the plating film, it is possible for a hard plating film to reliably protect the exposed surface of the support metal layer. Therefore, it is possible to improve the corrosion resistance of the support metal layer by the plating film.

The present invention (4) includes a method for producing a wiring circuit board producing the wiring circuit board described in (2) or (3) including the steps of preparing a support metal sheet having thermal conductivity of 5 W/m·K or more; forming a protective metal film, and an alignment mark metal film spaced apart from the protective metal film and having a first opening portion from the same metal thin film on one surface in a thickness direction of the support metal sheet; disposing an insulating layer on one surface in the thickness direction of the protective metal film; disposing a wiring layer on one surface in the thickness direction of the insulating layer; forming a second opening portion in the support metal sheet so as to include a first opening portion when projected in the thickness direction and expose an inner end edge of the first opening portion toward the other side in the thickness direction; disposing an etching resist on one surface and the other surface in the thickness direction of the support metal sheet with the inner end edge as a positioning reference so as to have generally the same pattern as a support metal layer when projected in the thickness direction; forming the support metal layer by etching the support metal sheet exposed from the etching resist from one side and the other side in the thickness direction thereof; and forming the protective thin film on an exposed surface of the support metal layer by a wet process.

In the method for producing a wiring circuit board, since the etching resist is disposed on one surface and the other surface in the thickness direction of the support metal sheet with the inner end edge of the first opening portion of the alignment mark metal film as the positioning reference so as to have generally the same pattern as the support metal layer when projected in the thickness direction, high positional accuracy of the etching resist can be achieved. Therefore, the support metal sheet exposed from the etching resist can be etched from one side and the other side in the thickness direction thereof, so that the support metal layer can be formed with high accuracy in a short time.

Moreover, since the protective metal film and the alignment mark metal film can be simultaneously formed from the same metal thin film, it is possible to reduce the number of production steps.

The present invention (5) includes a wiring circuit sheet for producing the wiring circuit board described in (2) or (3) including a support metal sheet having thermal conductivity of 5 W/m·K or more and having a second opening portion; an insulating layer disposed at at least one side in a thickness direction of the support metal sheet; a wiring layer; a protective metal film disposed at spaced intervals to the second opening portion between the insulating layer and the support metal sheet; and an alignment mark metal film disposed on one surface in the thickness direction of the support metal sheet, having a first opening portion included in the second opening portion when projected in the thickness direction, and having an inner end edge of the first opening portion exposed toward the other side in the thickness direction through the second opening portion.

Since the wiring circuit sheet includes the alignment mark metal film having the first opening portion, the inner end edge of the first opening portion can be used as the positioning reference that can be confirmed from both sides of one side and the other side in the thickness direction.

Effect of the Invention

In the wiring circuit board of the present invention, a support metal layer is excellent in corrosion resistance.

In the method for producing a wiring circuit board of the present invention, it is possible to form a support metal layer with high accuracy.

In the wiring circuit sheet of the present invention, an inner end edge of a first opening portion can be used as a positioning reference that can be confirmed from both sides of one side and the other side in a thickness direction.

BRIEF DESCRIPTION OF THE DRAWINGS

FIGS. 2A to 2C show steps for illustrating a method for producing the wiring circuit board shown in FIG. 1:

FIG. 2A illustrating a step of preparing a support metal layer,

FIG. 2B illustrating a step of disposing a protective metal film, and

FIG. 2C illustrating a step of disposing a base insulating layer.

FIGS. 3D to 3F, subsequent to FIG. 2C, show steps for illustrating a method for producing the wiring circuit board shown in FIG. 1:

FIG. 3D illustrating a step of disposing a wiring layer,

FIG. 3E illustrating a step of disposing a cover insulating layer, and

FIG. 3F illustrating a step of disposing a plating film.

FIGS. 8A to 8F show production steps of the wiring circuit board shown in FIG. 7:

FIG. 8A illustrating a step of preparing a support metal sheet,

FIG. 8B illustrating a step of disposing a metal thin film,

FIG. 8C illustrating a step of disposing a base insulating layer,

FIG. 8D illustrating a step of disposing a wiring layer,

FIG. 8E illustrating a step of forming a protective metal film and an alignment mark metal film, and FIG. 8F illustrating a step of disposing a cover insulating portion.

FIGS. 9G to 9J, subsequent to FIG. 8F, show production steps of the wiring circuit board shown in FIG. 7:

FIG. 9G illustrating a step of disposing an etching resist,

FIG. 9H illustrating a step of forming a second opening portion,

FIG. 9I illustrating a step of removing the etching resist, and

FIG. 9J illustrating a step of preparing first and second dry film resists, disposing first and second photomasks on the first and second dry film resists, and exposing the first and second dry film resists through the first and second photomasks.

FIG. 10K illustrating a step of forming first and second etching resists,

FIG. 10L illustrating a step of etching a support metal sheet,

FIG. 10M illustrating a step of removing the first and second etching resists, and FIG. 10N illustrating a step of forming a plating film.

DESCRIPTION OF EMBODIMENTS

First Embodiment

Figure 1:
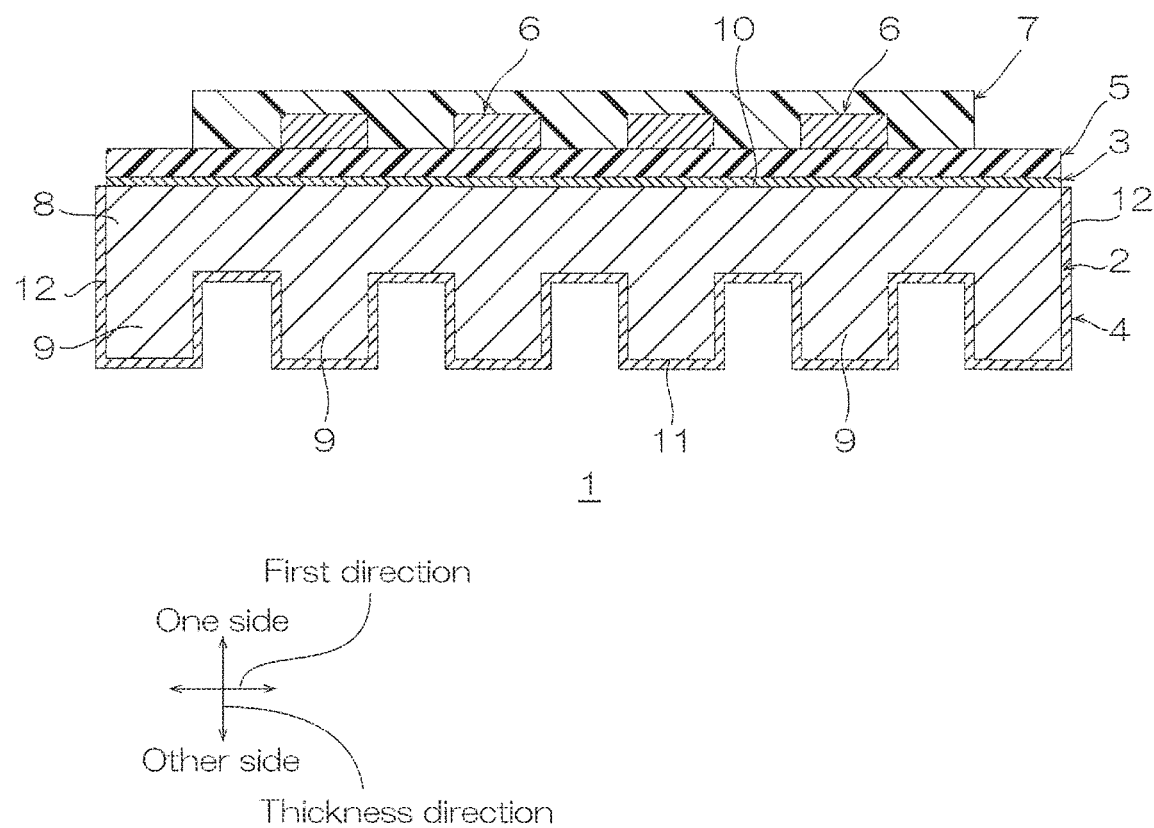
FIG. 1 shows a cross-sectional view of a first embodiment of a wiring circuit board of the present invention.

A first embodiment of a wiring circuit board of the present invention is described with reference to FIG. 1.

A wiring circuit board 1 has one surface and the other surface in a thickness direction facing each other in the thickness direction, and has a shape extending in a plane direction perpendicular to the thickness direction. The wiring circuit board 1 includes a support metal layer 2, a protective metal film 3, a plating film 4 as one example of a protective thin film, a base insulating layer 5 as one example of an insulating layer, a wiring layer 6, and a cover insulating layer 7. Preferably, the wiring circuit board 1 includes only the support metal layer 2, the protective metal film 3, the plating film 4, the base insulating layer 5, the wiring layer 6, and the cover insulating layer 7.

The support metal layer 2 is a heat sink for diffusing the heat from the wiring layer 6 to the outside, while supporting the wiring circuit board 1. The support metal layer 2 has a generally comb-shape when viewed in the cross-sectional view. The support metal layer 2 integrally includes a base portion 8 and a protruding portion 9. The base portion 8 has a generally flat plate shape extending in the plane direction. The protruding portion 9 extends from the other surface in the thickness direction of the base portion 8 toward the other side in the thickness direction. The plurality of protruding portions 9 are disposed in parallel at spaced intervals to each other in a first direction (direction included in the plane direction and corresponding to a parallel direction of the wiring layer 6 to be described later). The support metal layer 2 integrally has a first support surface 10 which is one surface in the thickness direction, a second support surface 11 which is the other surface in the thickness direction, and a support side surface 12 which is a side surface.

The first support surface 10 is a flat surface along the plane direction. The first support surface 10 is one surface in the thickness direction of the base portion 8.

The second support surface 11 is disposed at spaced intervals on the other side in the thickness direction of the first support surface 10. The second support surface 11 is an uneven surface corresponding to the protruding portion 9.

The support side surface 12 is a connecting surface connecting the peripheral end edge of the first support surface 10 to the peripheral end edge of the second support surface 11. Further, the support side surface 12 is an outer peripheral side surface of the support metal layer 2. The support side surface 12 is a flat surface along the thickness direction.

The first support surface 10, the second support surface 11, and the support side surface 12 form the surface of the support metal layer 2.

Thermal conductivity of the support metal layer 2 is 5 W/m·K or more. When the thermal conductivity of the support metal layer 2 is below 5 W/m·K, it is not possible for the support metal layer 2 to efficiently release the heat generated in the wiring layer 6 toward the other side in the thickness direction.

The thermal conductivity of the support metal layer 2 is preferably 10 W/m·K or more, further more preferably 15 W/m·K or more, 20 W/m·K or more, 25 W/m·K or more, 30 W/m·K or more, 35 W/m·K or more, 40 W/m·K or more, 50 W/m·K or more, 60 W/m·K or more, 75 W/m·K or more, 100 W/m·K or more, 200 W/m·K or more, 300 W/m·K or more, 350 W/m·K or more. The thermal conductivity of the support metal layer 2 is, for example, 10000 W/m·K or less. When the thermal conductivity of the support metal layer 2 is the above-described lower limit or more, it is possible for the support metal layer 2 to efficiently release the heat generated in the wiring layer 6 toward the other side in the thickness direction. The thermal conductivity of the support metal layer 2 is determined by JIS H 7903: 2008 (effective thermal conductivity measurement method).

Examples of a material for the support metal layer 2 include metals having excellent thermal conductivity. Further, as the material for the support metal layer 2, since the support metal layer 2 is protected (subjected to rust prevention processing) by the protective metal film 3 and the plating film 4 to be described in detail later, a metal having low corrosion resistance is also allowed. Specifically, examples of the material for the support metal layer 2 include metals such as copper, silver, iron, aluminum, chromium, or alloys thereof. Preferably, from the viewpoint of obtaining excellent thermal conductivity, copper and a metal including copper such as copper alloy are used. The materials for the base portion 8 and the protruding portion 9 are the same.

A dimension of the support metal layer 2 is appropriately set in accordance with its application and purpose. A thickness of the base portion 8 is, for example, 30 μm or more, preferably 100 μm or more, and for example, 10 mm or less. A protruding length (length in the thickness direction) of the protruding portion 9 from the other surface in the thickness direction of the base portion 8 is, for example, 100 μm or more, and for example, 100 mm or less.

The protective metal film 3 is disposed on the entire surface of the support metal layer 2 between the support metal layer 2 and the base insulating layer 5 to be described next. Specifically, the protective metal film 3 is disposed on the entire first support surface 10 of the support metal layer 2. In other words, the protective metal film 3 covers the entire first support surface 10.

The protective metal film 3 is, for example, a sputtering thin film, a plating thin film, or the like, and is preferably a sputtering thin film. A forming method of the protective metal film 3 is described later.

Examples of a material for the protective metal film 3 include metals having excellent corrosion resistance. Specifically, examples of the material for the protective metal film 3 include metals such as chromium, nickel, or alloys thereof. Further, the metal may include a metal oxide, and for example, a chromium oxide is used. Preferably, chromium is used.

A thickness of the protective metal film 3 is, for example, generally the same length over the plane direction. The thickness of the protective metal film 3 is, for example, 1 nm or more, preferably 10 nm or more, more preferably 20 nm or more, further more preferably 100 nm or more, and for example, 10000 nm or less, preferably 1000 nm or less, more preferably 500 nm or less.

The plating film 4 is a corrosion resistance-imparting layer (rust preventive layer) for improving the corrosion resistance of the second support surface 11 and the support side surface 12 which are one example of an exposed surface exposed from the protective metal film 3 in the support metal layer 2. The plating film 4 is disposed on the second support surface 11 and the support side surface 12 of the support metal layer 2. Specifically, the plating film 4 is continuously in contact with the second support surface 11 and the support side surface 12, and covers these surfaces. The plating film 4 is formed by following the uneven surface of the second support surface 11.

Therefore, the entire surface of the support metal layer 2 is protected (covered) by the protective metal film 3 and the plating film 4. That is, the first support surface 10 of the support metal layer 2 is protected by the protective metal film 3, and the second support surface 11 and the support side surface 12 of the support metal layer 2 are protected by the plating film 4.

The plating film 4 is a layer formed by plating to be described later.

The plating film 4 may be either a single layer or a multilayer. Preferably, the plating film 4 has a first plating film and a second plating film which are formed in this order on the second support surface 11 and the support side surface 12.

Examples of a material for the plating film 4 include corrosion resistant metals (rust preventive metals) such as nickel, gold, or alloys thereof. Further, when the plating film 4 has the first plating film and the second plating film, preferably, the material for the first plating film is nickel, and the material for the second plating film is gold.

A thickness of the plating film 4 is not particularly limited, and is, for example, 1 nm or more, preferably 10 nm or more, more preferably 100 nm or more, and for example, 1000 μm or less, preferably 100 μm or less.

The base insulating layer 5 is an insulating layer for insulating the wiring layer 6 from the protective metal film 3, and accordingly, for insulating the wiring layer 6 from the support metal layer 2.

The base insulating layer 5 is disposed on one surface in the thickness direction of the protective metal film 3. Specifically, the base insulating layer 5 is in contact with the entire one surface in the thickness direction of the protective metal film 3. Further, the base insulating layer 5 is disposed adjacent to one side in the thickness direction of the support metal layer 2 at spaced intervals thereto (intervals at which the protective metal film 3 is formed). The base insulating layer 5 has a sheet shape extending along the plane direction.

Examples of a material for the base insulating layer 5 include insulating resins such as thermosetting resins and thermoplastic resins. Further, the material for the base insulating layer 5 includes a transparent resin having transparency. Examples of the thermosetting resin include an epoxy resin and a thermosetting polyimide resin. An example of the thermoplastic resin includes an acrylic resin. Preferably, a thermosetting resin is used, more preferably, a thermosetting polyimide resin is used.

The wiring layer 6 transmits, for example, an electrical signal.

The wiring layer 6 is disposed on one surface in the thickness direction as one example of a front surface of the base insulating layer 5. The wiring layers 6 are disposed in parallel at spaced intervals to each other in the first direction. In addition, the wiring layer 6 extends in a second direction (direction included in the plane direction, and direction perpendicular to the first direction and the thickness direction; the depth direction on the plane of the sheet in FIG. 1), and terminals which are not shown are continuous to both end edges in the second direction of the wiring layer 6.

Examples of a material for the wiring layer 6 include copper, silver, gold, iron, aluminum, chromium, or alloys thereof. Preferably, from the viewpoint of obtaining excellent electrical properties, copper is used.

A thickness of the wiring layer 6 is, for example, 1 μm or more, preferably, 5 μm or more, and for example, 50 μm or less, preferably, 3 μm or less. A width and an interval of the wiring layer 6 are, for example, 1 μm or more, preferably 5 μm or more, and for example, 200 μm or less, preferably 100 μm or less.

The cover insulating layer 7 is an insulating layer for protecting the surface of the wiring layer 6. The cover insulating layer 7 is disposed on one surface in the thickness direction of the base insulating layer 5 so as to cover the wiring layer 6. Specifically, the cover insulating layer 7 is in contact with one surface and the side surface in the thickness direction of the wiring layer 6, and one surface in the thickness direction of the base insulating layer 5 around the wiring layer 6. A material for the cover insulating layer 7 is the same as the material for the base insulating layer 5. A thickness of the cover insulating layer 7 is, for example, 1 μm or more, preferably 5 μm or more, and for example, 100 μm or less, preferably 50 μm or less.

Next, a method for producing the wiring circuit board 1 is described with reference to FIGS. 2A to 3F.

A method for producing the wiring circuit board 1 includes a step (ref: FIG. 2A) of preparing the support metal layer 2, a step (ref: FIG. 2B) of disposing the protective metal film 3, a step (ref: FIG. 2C) of disposing the base insulating layer 5, a step (ref: FIG. 3D) of disposing the wiring layer 6, a step (ref: FIG. 3E) of disposing the cover insulating layer 7, and a step (ref: FIG. 3F) of disposing the plating film 4. In this producing method, the above-described steps are carried out in the order described above.

As shown in FIG. 2A, in the step of preparing the support metal layer 2, for example, a thick plate member is prepared, and subsequently, trimming is carried out so that the protruding portion 9 is formed to form the support metal layer 2 including the base portion 8 and the protruding portion 9.

As shown in FIG. 2B, next, in the step of disposing the protective metal film 3, for example, a metal thin film forming method such as a dry process or a wet process is used. Examples of the dry process include sputtering, ion plating, and vacuum deposition. An example of the wet process includes plating. These can be used alone or in combination of two or more. Preferably, a dry process is used, more preferably, sputtering is used.

The protective metal film 3 is formed on the entire surface of the first support surface 10 of the support metal layer 2 by the metal thin film forming method described above. Even by the metal thin film forming method described above, the protective metal film 3 are not formed on the second support surface 11 and the support side surface 12 of the support metal layer 2, and on the second support surface 11 and the support side surface 12 of the support metal layer 2 remain exposed.

As shown in FIG. 2C, next, in the step of disposing the base insulating layer 5, for example, first, the insulating resin described above is applied to one surface in the thickness direction of the protective metal film 3 to be dried to form a film. Thereafter, if necessary, it is heated. Further, when the insulating resin is the thermosetting resin, a B-stage film is formed by the above-described application and drying and subsequently, is brought into a C-stage state by heating.

As shown in FIG. 3D, next, in the step of disposing the wiring layer 6, for example, a wiring forming method such as an additive method or a subtractive method is used.

As shown in FIG. 3E, next, in the step of disposing the cover insulating layer 7, for example, first, the insulating resin described above is applied to one surface in the thickness direction of the protective metal film 3 to be dried to form a film. Thereafter, if necessary, it is heated.

Thus, a plating preparation body 22 including the support metal layer 2, the protective metal film 3, the base insulating layer 5, the wiring layer 6, and the cover insulating layer 7 is fabricated.

As shown in FIG. 3F, thereafter, in the step of disposing the plating film 4, by subjecting the second support surface 11 and the support side surface 12 of the support metal layer 2 to plating, the plating film 4 is formed on the second support surface 11 and the support side surface 12.

Examples of the plating include electrolytic plating and electroless plating. Preferably, electroless plating is used.

Specifically, the plating preparation body 22 is immersed in a plating bath (plating solution).

The plating solution contains the corrosion resistant metal and/or ions thereof described above. A mixing ratio, plating conditions, or the like of each of the components described above are appropriately set.

In the plating, the corrosion resistant metal (plating) is grown from the second support surface 11 and the support side surface 12 of the support metal layer 2, so that the plating film 4 is formed.

Thus, the wiring circuit board 1 is obtained.

Figure 4:
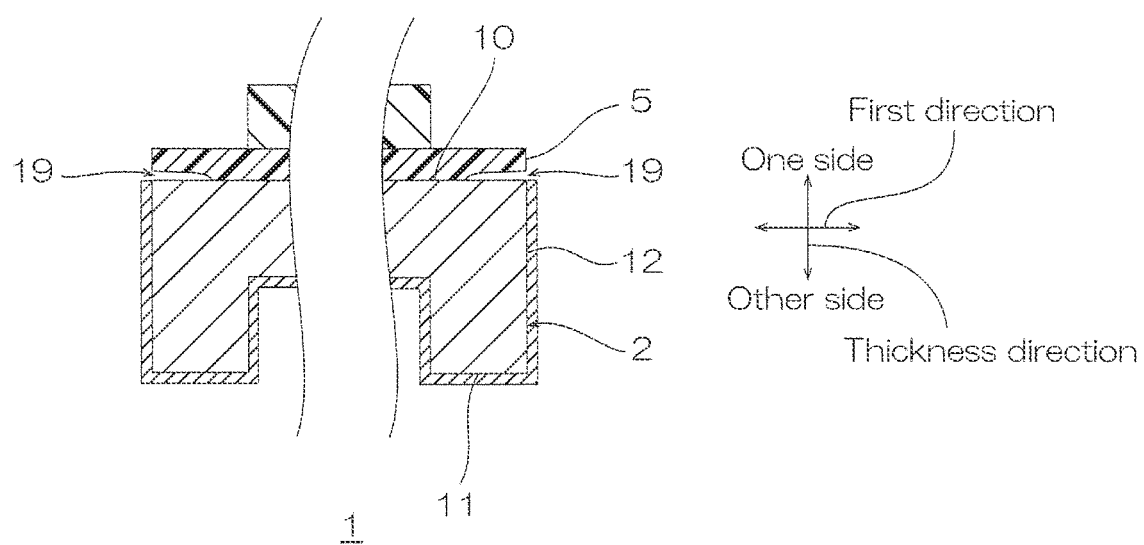
FIG. 4 shows a cross-sectional view of both end portions in a first direction of a wiring circuit board of Comparative Example 1 without including a protective metal film.

Then, as shown in Comparative Example 1 of FIG. 4, when the wiring circuit board 1 is not provided with the protective metal film 3 (ref: FIG. 1), and the other surface in the thickness direction of the base insulating layer 5 is adjacent to the first support surface 10 of the support metal layer 2, a minute gap 19 is easily formed between the peripheral end edge of the other surface in the thickness direction of the base insulating layer 5 and the peripheral end edge of the first support surface 10. Then, as shown in FIG. 3F, in the plating of the support metal layer 2 on the support side surface 12, a plating solution cannot sufficiently enter the gap 19, and therefore, the plating film 4 (plating) is not formed in the peripheral end edge facing the gap 19 in the first support surface 10 to remain exposed. Then, the peripheral end edge of the first support surface 10 becomes a starting point of corrosion, and thus, the entire support metal layer 2 is corroded.

However, as shown in FIG. 1, in the wiring circuit board 1 of the first embodiment, the protective metal film 3 is disposed on the entire first support surface 10 of the support metal layer 2. Therefore, as shown in FIG. 3F, when the plating film 4 is formed by plating, even in a case where the plating solution does not enter the gap 19 described above, it is possible to prevent the exposure of the peripheral end edge of the first support surface 10 of the support metal layer 2, and as a result, it is possible to suppress the corrosion described above.

Furthermore, the plating film 4 is also disposed on the second support surface 11 and the support side surface 12 of the support metal layer 2.

Therefore, the support metal layer 2 is excellent in corrosion resistance.

The applications of the wiring circuit board 1 are not particularly limited, and can be used in various fields. The wiring circuit board 1 is, for example, used for various applications such as a wiring circuit board for an electronic device (wiring circuit board for an electronic component) and a wiring circuit board for an electrical device (wiring circuit board for an electrical component). Examples of the wiring circuit board for an electronic device and the wiring circuit board for an electrical device include wiring circuit boards for sensors used for sensors such as position information sensors, obstacle detection sensors, and temperature sensors; wiring circuit boards for transport vehicles used for transport vehicles such as automobiles, trains, aircrafts, and working vehicles; wiring circuit boards for video equipment used for video equipment such as flat panel displays, flexible displays, and projection video equipment; wiring circuit boards for communication relaying equipment used for communication relay devices such as network equipment and large communication equipment; wiring circuit boards for information processing terminals used for information processing terminals such as computers, tablets, smartphones, and home games; wiring circuit boards for mobile devices used for mobile devices such as drones and robots; wiring circuit boards for medical devices used for medical devices such as wearable medical equipment and medical diagnostic devices; wiring circuit boards for electrical devices used for electrical devices such as refrigerators, washing machines, vacuum cleaners, and air conditioners; and wiring circuit boards for recording electronic devices used for recording electronic devices such as digital cameras and DVD recording devices.

MODIFIED EXAMPLES

In the following modified examples, the same reference numerals are provided for members and steps corresponding to each of those in the above-described first embodiment, and their detailed description is omitted. Further, each of the modified examples can achieve the same function and effect as that of the first embodiment unless otherwise specified. Furthermore, the first embodiment and the modified examples can be appropriately used in combination.

In the wiring circuit board 1 shown in FIG. 1, the plating film 4 is used as one example of a protective thin film of the present invention. Alternatively, for example, a resin protective thin film made of an organic material may be also used. Examples of the organic material include polymers (resins) such as epoxy-based polymers, acrylic polymers, and urethane-based polymers.

In addition, in the first embodiment, the support metal layer 2 has the protruding portion 9. Alternatively, for example, though not shown, the support metal layer 2 may be also formed of only the base portion 8 without including the protruding portion 9. In this case, the support metal layer 2 has a generally rectangular shape when viewed in the cross-sectional view, and the second support surface is a flat surface parallel with the first support surface 10.

In the first embodiment, the plating film 4 which is one example of a protective thin film is formed by plating. Alternatively, for example, a protective thin film (specifically, a resin protective thin film) can be also formed by a wet process other than plating.

Preferably, the protective thin film is the plating film 4. When the protective thin film is the plating film, the hard plating film 4 can be reliably brought into tight contact with the exposed surface of the support metal layer 2. Therefore, it is possible to improve the corrosion resistance of the support metal layer 2 by the plating film 4.

Further, when it is possible to protect the exposed surface (the second support surface 11 and the support side surface 12) of the support metal layer 2, from the viewpoint of function, the protective thin film is not limited to the corrosion resistance-imparting layer (rust preventive layer). Alternatively, for example, the protective thin film may be a coating agent (rust preventive coating agent), an abrasion resistant layer, a chemical resistant layer, a weather resistant layer, a marking-imparting layer, and a static electricity countermeasure layer.

Figure 5:
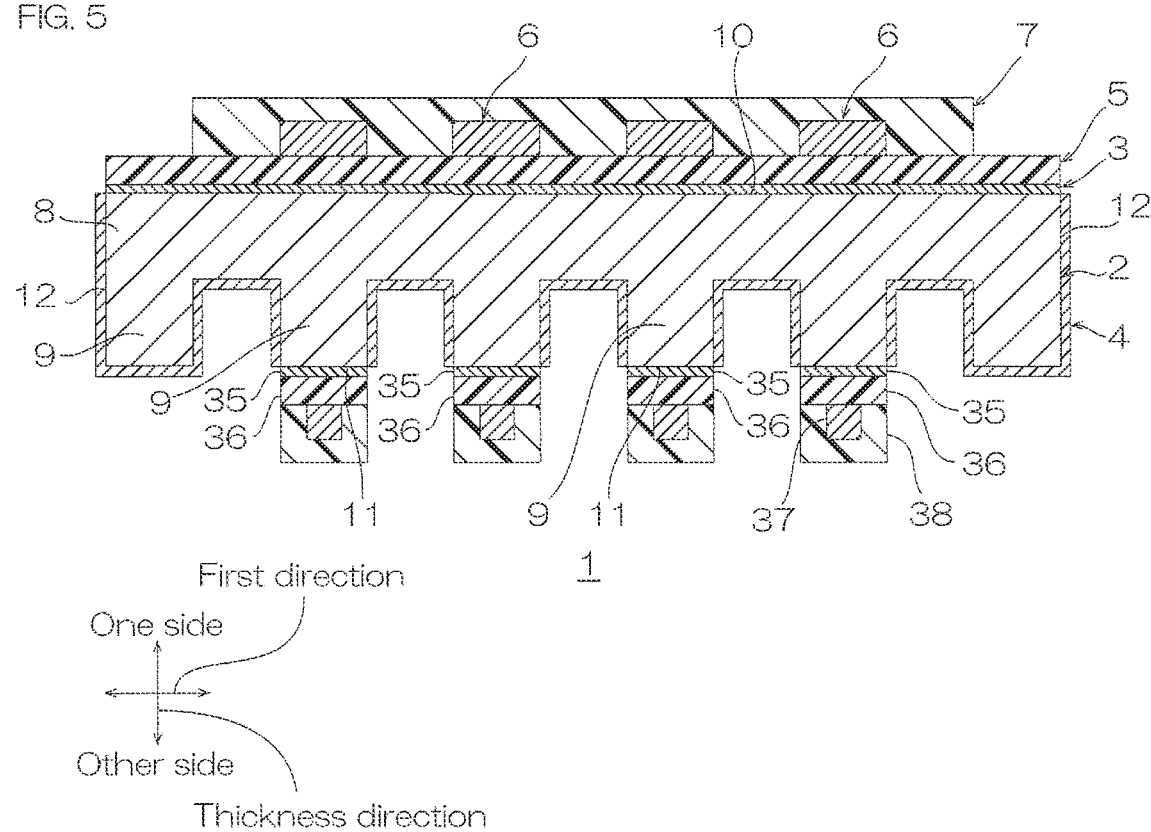
FIG. 5 shows a cross-sectional view of a modified example of the wiring circuit board shown in FIG. 2.

Further, in the first embodiment, as shown in FIG. 1, the insulating layer (the base insulating layer 5) is disposed only on one side in the thickness direction of the support metal layer 2. Alternatively, the insulating layer may be disposed on at least one side in the thickness direction of the support metal layer 2. As shown in FIG. 5, for example, the insulating layer (the base insulating layer 5 and a second base insulating layer 36 to be described next) may be also disposed on both sides of one side and the other side in the thickness direction of the support metal layer 2.

As shown in FIG. 5, in the modified example, the wiring circuit board 1 in which the insulating layer is disposed on both sides in the thickness direction of the support metal layer 2 further includes a second protective metal film 35, the second base insulating layer 36, a second wiring layer 37, and a second cover insulating layer 38 in addition to each of the layers described above.

The second protective metal film 35 is disposed on the entire second support surface 11 in the protruding portion 9 facing the wiring layer 6 in the thickness direction of the second support surface 11 of the support metal layer 2. The plating film 4 is not formed on the entire second support surface 11 in the protruding portion 9 facing the wiring layer 6 in the thickness direction, and the second protective metal film 35 is formed thereon. A material, a dimension, or the like of the second protective metal film 35 are the same as those of the protective metal film 3.

The entire surface of the support metal layer 2 is protected (covered) by the second protective metal film 35, the protective metal film 3, and the plating film 4.

The second base insulating layer 36 is disposed on the other surface in the thickness direction of the second protective metal film 35. Thus, the second base insulating layer 36 is disposed on the other side in the thickness direction of the support metal layer 2 through the second protective metal film 35. The second protective metal film 35 is disposed on the entire second support surface 11 of the protruding portion 9 described above between the protruding portion 9 and the second base insulating layer 36. A length (width) in the first direction of the second base insulating layer 36 is the same as that of the protruding portion 9. A material, a thickness, or the like of the second base insulating layer 36 are the same as those of the base insulating layer 5.

The second wiring layer 37 is disposed on the other surface in the thickness direction as one example of a front surface of the second base insulating layer 36. A length (width) in the first direction of the second wiring layer 37 is appropriately selected from the range illustrated in the wiring layer 6. A material, a thickness, or the like of the second wiring layer 37 are the same as those of the wiring layer 6.

The second cover insulating layer 38 is disposed on the other surface in the thickness direction of the second base insulating layer 36 so as to cover the second wiring layer 37. A material, a thickness, or the like of the second cover insulating layer 38 are the same as those of the cover insulating layer 7.

To produce the wiring circuit board 1 shown in FIG. 5, for example, the support metal layer 2 is prepared, then, the protective metal film 3 and the second protective metal film 35 are disposed, then, the base insulating layer 5 and the second base insulating layer 36 are disposed, then, the wiring layer 6 and the second wiring layer 37 are disposed, next, the cover insulating layer 7 and the second cover insulating layer 38 are disposed, and thereafter, the plating film 4 is disposed.

To dispose the second protective metal film 35, for example, first, after masking the support side surface 12, and the second support surface 11 on which the second protective metal film 35 is not formed, the second protective metal film 35 is formed on the second support surface 11 exposed from the mask. The mask is then removed. The second protective metal film 35 can be formed simultaneously with the protective metal film 3.

Then, in the wiring circuit board 1, the second protective metal film 35 is disposed on the entire second support surface 11 in the protruding portion 9 described above of the support metal layer 2. Therefore, when the plating film 4 is formed by plating, even in a case where the plating solution does not enter the gap described above, it is possible to prevent the exposure of the peripheral end edge of the second support surface 11 of the protruding portion 9, and as a result, it is possible to suppress the corrosion described above.

Furthermore, the plating film 4 is also disposed on the support side surface 12 of the support metal layer 2 and the second support surface 11 exposed from the second protective metal film 35.

Therefore, the support metal layer 2 is excellent in corrosion resistance.

Second Embodiment

A second embodiment of a wiring circuit board and a method for producing a wiring circuit board of the present invention is described with reference to FIGS. 6 to 10N.

In the following second embodiment, the same reference numerals are provided for members and steps corresponding to each of those in the above-described first embodiment, and their detailed description is omitted. Further, the second embodiment can achieve the same function and effect as that of the first embodiment unless otherwise specified. Furthermore, the first embodiment and the second embodiment can be appropriately used in combination.

Figure 6:
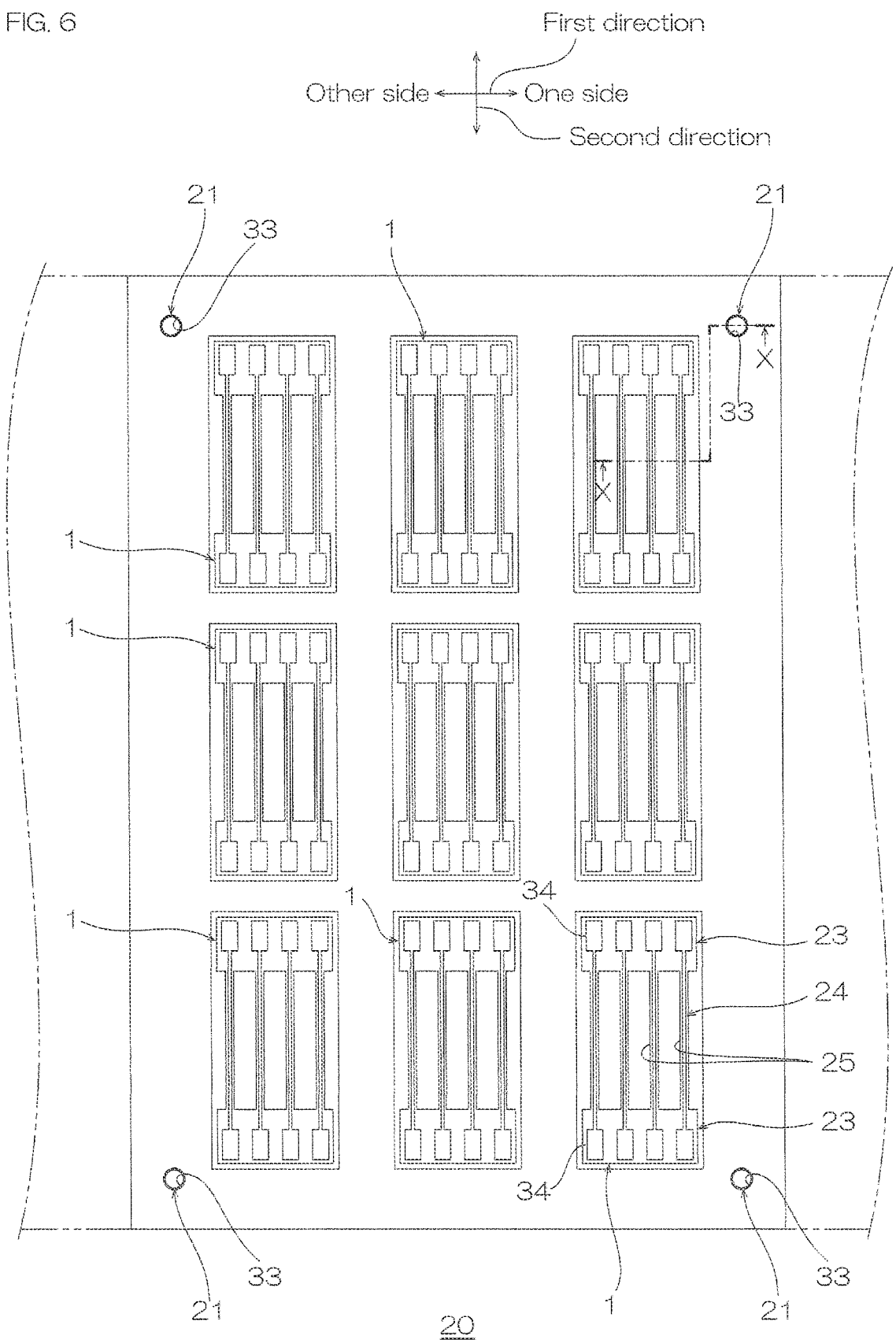
FIG. 6 shows a plan view of a second embodiment of a wiring circuit board of the present invention.

As shown in FIG. 6, the plurality of wiring circuit boards 1 are provided in a wiring circuit board assembly sheet 20.

The wiring circuit board assembly sheet 20 has one surface and the other surface in the thickness direction, and has a generally rectangular sheet shape extending in the plane direction perpendicular to the thickness direction (direction including the first direction and the second direction).

Figure 7:
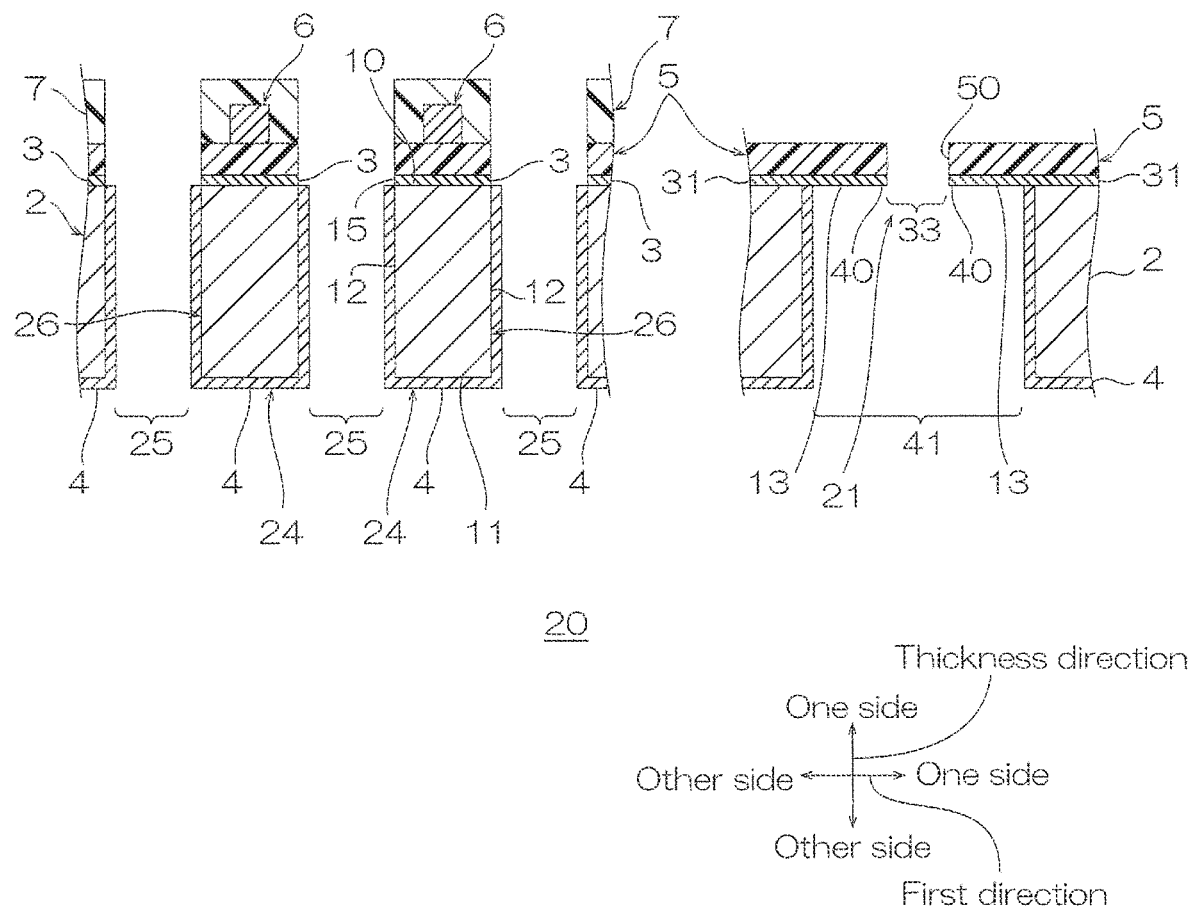
FIG. 7 shows an enlarged cross-sectional view along an X-X line of the wiring circuit board shown in FIG. 6.

The wiring circuit board assembly sheet 20 is an assembly sheet including the plurality of wiring circuit boards 1 and a plurality of alignment marks 21. Further, as shown in FIG. 7, the wiring circuit board assembly sheet 20 includes the support metal layer 2, the protective metal film 3, the plating film 4, the base insulating layer 5, the wiring layer 6, and the cover insulating layer 7 described above.

The plurality of wiring circuit boards 1 are disposed in alignment at spaced intervals to each other in the wiring circuit board assembly sheet 20. The wiring circuit boards 1 are connected in the wiring circuit board assembly sheet 20 by joints that are not shown with respect to the wiring circuit board assembly sheet 20 around the wiring circuit boards 1. The wiring circuit board 1 has a shape extending long in the second direction. The wiring circuit board 1 integrally includes two connecting bodies 23 which are disposed at spaced intervals in the second direction, and a wiring body 24.

The connecting bodies 23 form both end portions in the second direction of the wiring circuit board 1. The connecting body 23 has a generally rectangular flat plate shape that is slightly long in the first direction when viewed from the top. The connecting body 23 includes a terminal portion 34. In each of the connecting bodies 23, the terminal portions 34 are disposed in parallel at spaced intervals to each other in the first direction. Each of the terminal portions 34 has a generally rectangular (land) shape when viewed from the top.

The wiring body 24 forms an intermediate portion in the second direction of the wiring circuit board 1. The wiring body 24 is disposed between the two connecting bodies 23 when viewed from the top. The wiring body 24 has a shape extending in the second direction. The wiring body 24 bridges the two connecting bodies 23 in the second direction. Further, the plurality of wiring bodies 24 are disposed in parallel at spaced intervals to each other in the first direction. Each of both end portions in the second direction of the plurality of wiring bodies 24 is connected in the second direction by each of the two first connecting bodies 2.

Further, an opening portion 25 is formed between the wiring bodies 24 adjacent to each other. The plurality of opening portions 25 are, for example, formed in parallel across the wiring body 24 in the first direction. Each of the plurality of opening portions 25 has a shape extending in the second direction, and penetrates the wiring circuit board 1 in the thickness direction. The wiring bodies 24 and the opening portions 25 are disposed alternately in the first direction.

A length (width) in the first direction of each of the plurality of wiring bodies 24 is, for example, 500 µm or less, preferably 300 µm or less, more preferably 100 µm or less, and for example, 10 µm or more. A length (width) in the first direction of each of the plurality of opening portions 25 is, for example, 10 µm or more, preferably 50 µm or more, more preferably 100 µm or more, and for example, 1000 µm or less. A ratio of the length in the first direction of the wiring body 24 to the length in the first direction of the opening portion 25 is, for example, 40 or less, preferably, 10, or less, and for example, 0.1 or more, preferably, 0.5 or more.

The alignment mark 21 is disposed in each of the four corners. Each of the plurality of alignment marks 21 has a generally circular shape when viewed from the top.

Layer Configuration of Wiring Body and Alignment Mark

The details of each of the wiring body 24 and the alignment mark 21 are described with reference to FIG. 7. On the other hand, the connecting body 23 is briefly described.

Each of the plurality of wiring bodies 24 includes the support metal layer 2, the protective metal film 3, the plating film 4, the base insulating layer 5, the wiring layer 6, and the cover insulating layer 7 independently of each other.

In the wiring body 24, the support metal layer 2 is a heat sink for diffusing the heat from the wiring layer 6 to the outside, while supporting the wiring body 24. The support metal layer 2 has a generally rectangular shape when viewed in the cross-sectional view. The support metal layer 2 integrally has the first support surface 10, the second support surface 11, and the support side surface 12. The second support surface 11 is a flat surface parallel with the first support surface 10. The first support surface 10, the second support surface 11, and the support side surface 12 in the wiring body 24 form the surface of the support metal layer 2 in the wiring body 24.

A thickness of the support metal layer 2 in the wiring body 24 is allowed to be relatively thick, since it is formed by etching a support metal sheet 42 to be described later from both sides in the thickness direction. The thickness of the support metal layer 2 is, for example, 50 µm or more, preferably 100 µm or more, preferably 250 µm or more, preferably 500 µm or more, preferably 1000 µm or more, and for example, 10 mm or less. Further, a ratio (aspect ratio) of the thickness to the width of the support metal layer 2 is, for example, 2 or more, preferably 2.5 or more, more preferably 3 or more, further more preferably 3.5 or more, and for example, 1000 or less.

A length (width) in the first direction of the support metal layer 2 is appropriately selected from the range illustrated in the length in the first direction of the wiring body 24 described above, and specifically, is the same as the length in the first direction of the wiring body 24.

In the wiring body 24, the protective metal film 3 is disposed on the entire surface of the support metal layer 2 between the support metal layer 2 and the base insulating layer 5. Specifically, the protective metal film 3 is disposed on the entire first support surface 10 of the support metal layer 2 in the wiring body 24. That is, the protective metal film 3 covers the entire first support surface 10 of the support metal layer 2.

In the wiring body 24, the plating film 4 is a corrosion resistance-imparting layer (rust prevention layer) for improving the corrosion resistance of the second support surface 11 and the support side surface 12 of the support metal layer 2. The plating film 4 is disposed on the second support surface 11 and the support side surface 12 as one example of an exposed surface exposed from the support metal layer 2. The plating film 4 has a generally U-shape having an opening toward one side in the thickness direction when viewed in the cross-sectional view in the wiring body 24.

Therefore, the entire surface of the support metal layer 2 in the wiring body 24 is protected (covered) by the protective metal film 3 and the plating film 4. That is, the first support surface 10 of the support metal layer 2 in the wiring body 24 is protected by the protective metal film 3, and the second support surface 11 and the support side surface 12 of the support metal layer 2 in the wiring body 24 are protected by the plating film 4.

In the wiring body 24, the base insulating layer 5 is an insulating layer for insulating the wiring layer 6 from the protective metal film 3, and accordingly, for insulating the wiring layer 6 from the support metal layer 2. The base insulating layer 5 is disposed on one surface in the thickness direction of the protective metal film 3.

In the wiring body 24, the wiring layer 6 is disposed on one surface in the thickness direction as one example of a front surface of the base insulating layer 5. The one wiring layer 6 is, for example, provided in the one wiring body 24. Both end edges in the second direction of the wiring layer 6 are continuous to the terminal portions 34 (ref: FIG. 6).

In the wiring body 24, the cover insulating layer 7 is an insulating layer for protecting one surface and the side surface in the thickness direction of the wiring layer 6. The cover insulating layer 7 is in contact with one surface and the side surface in the thickness direction of the wiring layer 6, and one surface in the thickness direction of the base insulating layer 5 around the wiring layer 6.

The connecting body 23 includes a member corresponding to each of the layers (excluding the wiring layer 6) and each of the films described above. The connecting body 23 includes the terminal portion 34 formed from the same layer as the wiring layer 6.

The alignment mark 21 is formed from an alignment mark metal film 31 exposed from the support metal layer 2.

That is, a second opening portion 41 is formed in the support metal layer 2 in which the alignment mark metal film 31 is disposed.

The second opening portion 41 is a through hole penetrating the support metal layer 2 in the thickness direction, and has a larger dimension than an alignment mark opening portion 33 (described later) so as to include the alignment mark opening portion 33 when viewed from the bottom. Specifically, the maximum length (in the case of a generally circular shape when viewed from the top, the inner diameter) in the plane direction of the second opening portion 41 is, for example, 0.02 mm or more, preferably 0.2 mm or more, more preferably 2 mm or more, and for example, 50 mm or less, preferably 25 mm or less.

The alignment mark metal film 31 has the alignment mark opening portion 33 in the central portion.

On the other hand, the outer shape (outer end edge) of the alignment mark metal film 31 is not particularly limited as long as the alignment mark opening portion 33 described above is included. Further, since the alignment mark opening portion 33 is included in the second opening portion 41 when viewed from the bottom, the alignment mark metal film 31 includes a flange portion 13 exposed from the second opening portion 41 when viewed from the bottom. The alignment mark metal film 31, together with the protective metal film 3 in the wiring body 24, is formed into the above-described shape from the same metal thin film 43 (described later, ref: FIG. 8A).

The alignment mark metal film 31 integrally includes a portion disposed on the first support surface 10 of the support metal layer 2, and the flange portion 13 which is not supported by the first support surface 10 and exposed from the second opening portion 41.

Then, in the flange portion 13 of the alignment mark metal film 31, an inner end edge (inner peripheral end surface) 40 facing the alignment mark opening portion 33 constitutes the alignment mark 21. A shape of the inner end edge 40 is not particularly limited, and an example thereof includes a generally circular shape when viewed from the top (or when viewed from the bottom).

The inner end edge 40 of the alignment mark metal film 31 (the flange portion 13) is exposed toward (faces) the other side in the thickness direction through the second opening portion 41.

The maximum length (in the case of a generally circular shape when viewed from the top, the inner diameter) in the plane direction of the alignment mark opening portion 33 is, for example, 0.01 mm or more, preferably 0.1 mm or more, more preferably 1 mm or more, and for example, 25 mm or less, preferably 10 mm or less. The maximum length of the alignment mark opening portion 33 is small with respect to the maximum length in the plane direction of the second opening portion 41, and a ratio of the maximum length of the alignment mark opening portion 33 to the maximum length of the second opening portion 41 is, for example, below 1, preferably 0.9 or less, more preferably 0.8 or less, further more preferably 0.7 or less, and for example, 0.1 or more, preferably 0.2 or more.

Also, the plating film 4 is disposed on the inner peripheral surface facing the second opening portion 41.

On the other hand, the base insulating layer 5 having an insulating opening portion 50 which has the same shape as the alignment mark opening portion 33 when viewed from the top is formed on one surface in the thickness direction of the alignment mark metal film 31.

Next, a method for producing the wiring circuit board assembly sheet 20 and the wiring circuit board 1 is described with reference to FIGS. 8A to 10N. In the method for producing the wiring circuit board 1, any one of a single wafer method (batch method) (ref: solid line of FIG. 6) and a roll-to-roll method (ref: phantom line of FIG. 6) can be carried out.

The method for producing the wiring circuit board 1 includes a step (ref: FIG. 8A) of preparing the support metal sheet 42, a step (ref: FIG. 8B) of disposing the metal thin film 43, a step (ref: FIG. 8C) of disposing the base insulating layer 5, a step (ref: FIG. 8D) of disposing the wiring layer 6, a step (ref: FIG. 8E) of forming the protective metal film 3 and the alignment mark metal film 31, and a step (ref: FIG. 8F) of disposing the cover insulating layer 7.

Also, the method for producing the wiring circuit board 1 includes a step (ref: FIGS. 9G to 9I) of forming the second opening portion 41 in the support metal sheet 42 and a step (ref: FIGS. 9J to 10K) of disposing a first etching resist 45 and a second etching resist 55 as one example of an etching resist.

Furthermore, the method for producing the wiring circuit board 1 includes a step (ref: FIGS. 10L to 10M) of etching the support metal sheet 42 from one side and the other side in the thickness direction, a step (ref: FIG. 10N) of forming the plating film 4, and a step of taking out the wiring circuit board 1 from the wiring circuit board assembly sheet 20.

In the method for producing the wiring circuit board 1, the above-described steps are carried out in the order described above.

As shown in FIG. 8A, in the step of preparing the support metal sheet 42, the support metal sheet 42 having a generally sheet (plate) shape extending in the plane direction is prepared.

The support metal sheet 42 is a support metal preparation sheet for forming the support metal layer 2 of the wiring body 24, and the second opening portion 41 of the alignment mark 21. In particular, the support metal sheet 42 is an etching sheet for forming the second opening portion 41 by etching. The support metal sheet 42 has the first support surface 10 and the second support surface 11. Thermal conductivity and a material of the support metal sheet 42 are the same as those of the support metal layer 2 described above.

As shown in FIG. 8B, in the step of disposing the metal thin film 43, the metal thin film 43 is formed on the entire first support surface 10 of the support metal sheet 42 by the metal thin film forming method described above (preferably, sputtering). The metal thin film 43 is a preparation thin film for forming the protective metal film 3 and the alignment mark metal film 31.

As shown in FIG. 8C, in the step of disposing the base insulating layer 5, the base insulating layer 5 is formed on one surface in the thickness direction of the metal thin film 43 in the pattern described above. For example, a photosensitive resin is applied to one surface in the thickness direction of the protective metal film 3, and the base insulating layer 5 corresponding to the wiring body 24 is formed by photolithography for exposing and developing. The insulating opening portion 50 is formed in the base insulating layer 5.

As shown in FIG. 8D, in the step of disposing the wiring layer 6, the wiring layer 6 is formed on one surface in the thickness direction of the base insulating layer 5.

As shown in FIG. 8E, in the step of forming the protective metal film 3 and the alignment mark metal film 31, the metal thin film 43 exposed from the base insulating layer 5 is removed. For example, the metal thin film 43 around the base insulating layer 5 of the wiring body 24 and the metal thin film 43 exposed from the insulating opening portion 50 are removed simultaneously. In the above-described removal of the metal thin film 43, etching with the base insulating layer 5 as a mask (resist), peeling, or the like are used. Thus, the protective metal film 3 corresponding to the wiring body 24 and the alignment mark metal film 31 having the alignment mark opening portion 33 are simultaneously formed from the same metal thin film 43.

As shown in FIG. 8F, in the step of disposing the cover insulating layer 7, the cover insulating layer 7 is formed on one surface in the thickness direction of the base insulating layer 5 so as to cover the wiring layer 6.

As shown in FIGS. 9G to 9I, in the step of forming the second opening portion 41 in the support metal layer 2, for example, etching is used.

To form the second opening portion 41 by etching, first, as shown in FIG. 9G, an etching resist 44 is continuously disposed on the first support surface 10 of the support metal sheet 42 in the entire plane direction so as to cover the side surface of the protective metal film 3, the side surface of the base insulating layer 5, and the side surface and one surface in the thickness direction of the cover insulating layer 7.

At the same time, the etching resist 44 is disposed on the second support surface 11 of the support metal sheet 42 so that an etching resist opening portion 51 having the same pattern as the second opening portion 41 to be formed next when viewed from the bottom is formed.

Next, as shown in FIG. 9H, the support metal sheet 42 exposed from the etching resist 44 is etched. Specifically, the support metal sheet 42 exposed from the etching resist opening portion 51 is removed from the other side in the thickness direction by etching.

Thus, the second opening portion 41 is formed in the support metal sheet 42.

Then, the inner end edge 40 of the alignment mark opening portion 33 is exposed toward the other side in the thickness direction. Therefore, the inner end edge 40 becomes the alignment mark 21 which is visually recognized from the other side in the thickness direction through the second opening portion 41. On the other hand, since the base insulating layer 5 has transparency, the inner end edge 40 is also visually recognized from one side in the thickness direction.

Thereafter, as shown in FIG. 9I, the etching resist 44 is removed.

Thus, a wiring circuit sheet 60 including the support metal sheet 42, the base insulating layer 5, the wiring layer 6, the cover insulating layer 7, the protective metal film 3, and the alignment mark metal film 31 is obtained. The wiring circuit sheet 60 does not include the wiring body 24, the plating film 4, and the opening portion 25 yet. The wiring circuit sheet 60 is a preparation sheet for producing the wiring circuit board assembly sheet 20.

As shown in FIGS. 9J to 10K, in the step of disposing the first etching resist 45 and the second etching resist 55, each of the first etching resist 45 and the second etching resist 55 is disposed on one side and the other side in the thickness direction of the support metal sheet 42 with the inner end edge 40 of the alignment mark metal film 31 as a positioning reference so as to have generally the same pattern as the support metal layer 2 to be formed next when projected in the thickness direction.

Specifically, as shown in FIG. 9J, first, each of a first dry film resist 49 and a second dry film resist 59 is disposed on each of the entire one surface and the entire other surface in the thickness direction of the support metal sheet 42. An example of the first dry film resist 49 and the second dry film resist 59 includes a negative-type photoresist (negative photoresist). Each of the first dry film resist 49 and the second dry film resist 59 is continuously formed in the plane direction. Further, both the first dry film resist 49 and the second dry film resist 59 have light transmitting properties (transparency) to such a degree that the inner end edge 40 can be visually recognized from both sides in the thickness direction.

The first dry film resist 49 is disposed on the first support surface 10 so as to fill the insulating opening portion 50 and the alignment mark opening portion 33, and close one end edge in the thickness direction of the second opening portion 41. Further, the first dry film resist 49 is disposed on the first support surface 10 of the support metal sheet 42 so as to cover the side surface of the protective metal film 3, the side surface of the base insulating layer 5, and one surface in the thickness direction and the side surface of the cover insulating layer 7.

The second dry film resist 59 is disposed on the second support surface 11 so as to close the other end edge in the thickness direction of the second opening portion 41.

Subsequently, a first photomask 46 having a first light transmitting portion 47 and a first light shielding portion 48 is disposed at one side in the thickness direction of the first dry film resist 49. The first light transmitting portion 47 is a portion that transmits light when the first dry film resist 49 is exposed, and has a pattern corresponding to a first etching resist opening portion 52 (furthermore, the opening portion 25 shown in FIG. 10L) to be formed next to the first etching resist 45. The first light shielding portion 48 is a portion for shielding light when the first dry film resist 49 is exposed, and has a pattern corresponding to the opening portion 25.

At the same time, a second photomask 56 having a second light transmitting portion 57 and a second light shielding portion 58 is disposed on the other side in the thickness direction of the second dry film resist 59. The second light transmitting portion 57 is a portion that transmits light when the second dry film resist 59 is exposed, and has the same pattern as the first light transmitting portion 47. The second light shielding portion 58 is a portion for shielding light when the second dry film resist 59 is exposed, and has the same pattern as the first light shielding portion 48.

At this time, the first photomask 46 and the second photomask 56 are disposed with the inner end edge 40 as a positioning reference in the plane direction of the first light transmitting portion 47 and the first light shielding portion 48, and the second light transmitting portion 57 and the second light shielding portion 58.

Specifically, the first light transmitting portion 47 and the second light transmitting portion 57 are positioned in the plane direction with the inner end edge 40 as the positioning reference so as to be overlapped (match) with each other when projected in the thickness direction. At the same time, the first light shielding portion 48 and the second light shielding portion 58 are positioned in the plane direction with the inner end edge 40 as the positioning reference so as to be overlapped (match) with each other when projected in the thickness direction.

At this time, the inner end edge 40 is observed by a camera (not shown) from one side in the thickness direction through the base insulating layer 5 and the first dry film resist 49.

The inner end edge 40 is observed by the camera from the other side in the thickness direction through the second dry film resist 59 and the second opening portion 41.

Subsequently, as shown by arrows of FIG. 9J, the first dry film resist 49 is exposed through the first photomask 46. Further, the second dry film resist 59 is exposed through the second photomask 56.

Then, in the first dry film resist 49, a photosensitive portion which is exposed by the light transmitting through the first light transmitting portion 47 and an unsensitized portion corresponding to the first light shielding portion 48 are formed. Further, in the second dry film resist 59, a photosensitive portion which is exposed by the light transmitting through the second light transmitting portion 57 and an unsensitized portion corresponding to the second light shielding portion 58 are formed.

Thereafter, if necessary, the first dry film resist 49 and the second dry film resist 59 are heated after exposure.

Figure 10K:
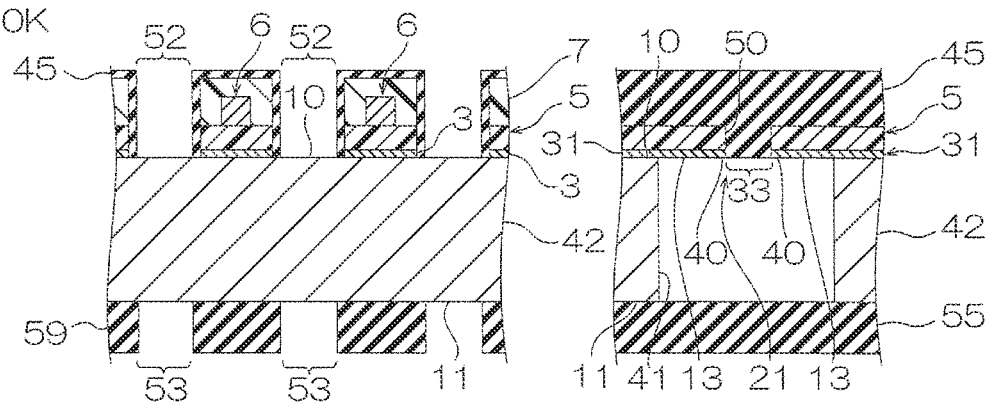
FIGS. 10K to 10N, subsequent to FIG. 9J, show production steps of the wiring circuit board shown in FIG. 7.
Figure 10L:
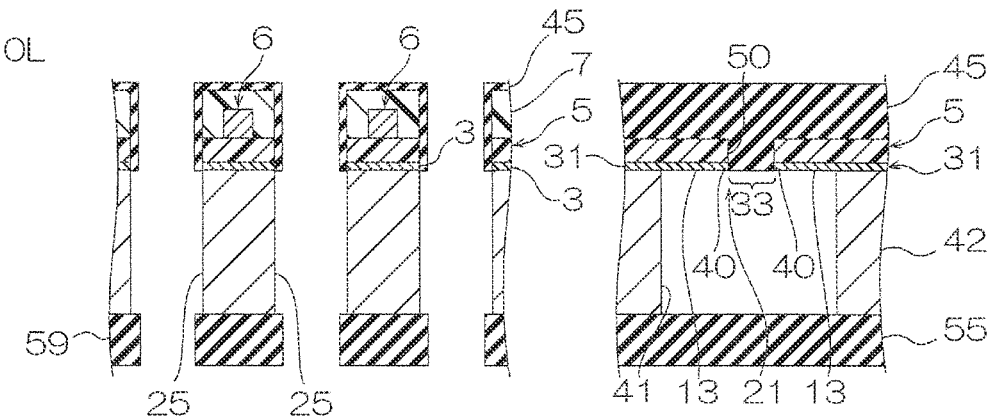
Figure 10M:
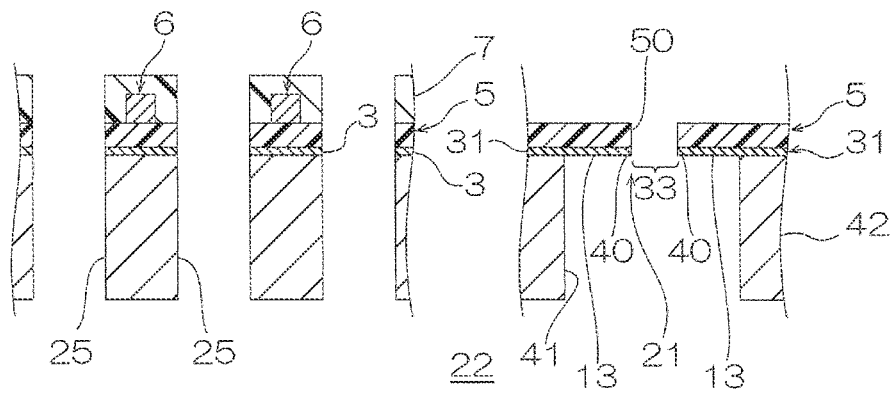
Figure 10N:
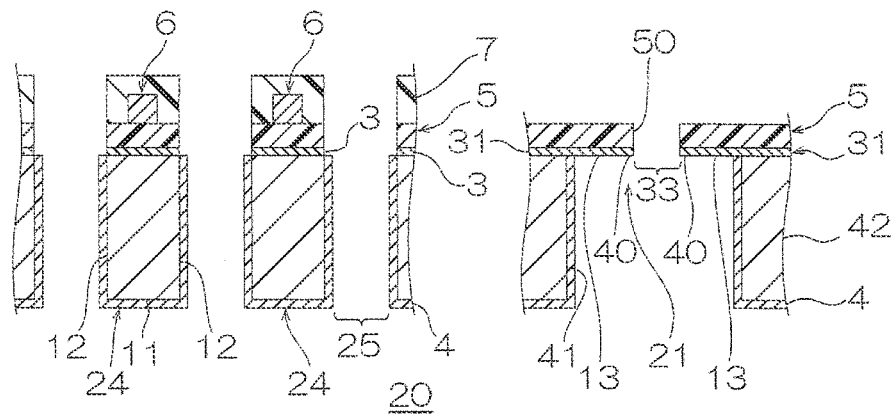

As shown in FIG. 10K, thereafter, the first dry film resist 49 and the second dry film resist 59 are developed. Thus, in the first dry film resist 49 and the second dry film resist 59, the unsensitized portion is removed, and the photosensitive portion remains.

Thus, the first etching resist 45 having the first etching resist opening portion 52 is formed from the first dry film resist 49. Further, the second etching resist 55 having the second etching resist opening portion 53 is formed from the second dry film resist 59. The first etching resist 45 and the second etching resist 55 have generally the same pattern as the support metal layer 2.

Then, as shown in FIG. 10L, in the step of etching the support metal sheet 42 exposed from the first etching resist 45 and the second etching resist 55, the support metal sheet 42 corresponding to the first etching resist opening portion 52 is etched from one side in the thickness direction, and at the same time, the support metal sheet 42 corresponding to the second etching resist opening portion 53 is etched from the other side in the thickness direction.

At this time, by the overetching in which etching excessively progresses, the support side surface 12 of the support metal layer 2 constituting the wiring body 24 is allowed to retract further inwardly in the first direction.

Thus, the support metal layer 2 of the wiring body 24 is formed from the support metal sheet 42.

As shown in FIG. 10M, thereafter, the first etching resist 45 and the second etching resist 55 are removed. Thus, the plating preparation body 22 before forming the plating film 4 is fabricated.

As shown in FIG. 10N, thereafter, in the step of forming the plating film 4, the second support surface 11 and the support side surface 12 of the support metal layer 2 are subjected to plating.

Thus, the wiring circuit board assembly sheet 20 including the wiring circuit board 1 and the alignment mark 21 is obtained.

Thereafter, by cutting joints (not shown), the wiring circuit board 1 is cut from its periphery to be taken out from the wiring circuit board assembly sheet 20. Thus, the wiring circuit board 1 is produced.

Figure 11:
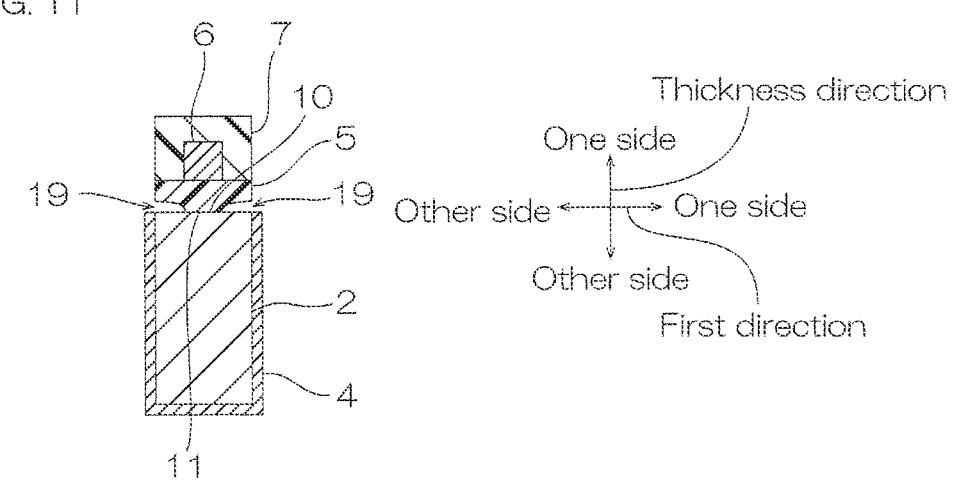
FIG. 11 shows a cross-sectional view of a wiring body of a wiring circuit board of Comparative Example 2 without including a protective metal film.

Then, as shown in Comparative Example 2 of FIG. 11, when the wiring body 24 is not provided with the protective metal film 3 (ref: FIG. 7), and the other surface in the thickness direction of the base insulating layer 5 is adjacent to the first support surface 10 of the support metal layer 2, since the peripheral end edge of the other surface in the thickness direction of the base insulating layer 5 is excessively removed (overdevelopment) during development in photolithography (exposure and development) at the time of forming the base insulating layer 5, the minute gap 19 is easily formed between the peripheral end edge of the other surface in the thickness direction of the base insulating layer 5 and the peripheral end edge of the first support surface 10. Then, as referred to FIG. 10N, in the plating of the support metal layer 2 on the support side surface 12, a plating solution cannot sufficiently enter the gap 19, and therefore, the plating film 4 is not formed in the peripheral end edge facing the gap 19 in the first support surface 10 to remain exposed. Then, the peripheral end edge of the first support surface 10 becomes a starting point of corrosion, and thus, the support metal layer 2 in each of the plurality of wiring bodies 24 is corroded.

However, as shown in FIG. 7, in the wiring circuit board 1 of the second embodiment, the protective metal film 3 is disposed on the entire first support surface 10 of the support metal layer 2 in each of the plurality of wiring bodies 24. Therefore, it is possible to suppress the corrosion of the peripheral end edge of the first support surface 10 of the support metal layer 2 due to the formation of the gap 19 (ref: FIG. 11). Furthermore, the plating film 4 is disposed on the second support surface 11 and the support side surface 12 of the support metal layer 2.

Therefore, the support metal layer 2 in the wiring body 24 is excellent in corrosion resistance.

Furthermore, in the wiring circuit board 1, since the wiring bodies 24 are disposed in parallel at spaced intervals to each other, it is possible to achieve efficient heat dissipation by convecting the heat generated in the wiring layer 6 through the air between the plurality of wiring bodies 24.

Further, as shown in FIGS. 9J to 10K, in the method for producing the wiring circuit board 1, the first etching resist 45 having the first etching resist opening portion 52 and the second etching resist 55 having the second etching resist opening portion 53 are disposed on the first support surface 10 and the second support surface 11 of the support metal sheet 42 with the inner end edge 40 as the positioning reference so as to have generally the same pattern as the support metal layer 2 when projected in the thickness direction. Therefore, high positional accuracy of the first etching resist opening portion 52 and the second etching resist opening portion 53 can be achieved. Therefore, the support metal sheet 42 exposed from the first etching resist opening portion 52 and the second etching resist opening portion 53 can be etched from one side and the other side in the thickness direction thereof, so that the support metal layer 2 can be formed with high accuracy in a short time.

Moreover, as shown in FIGS. 8B and 8E, since the protective metal film 3 and the alignment mark opening portion 33 can be simultaneously formed from the same metal thin film 43, it is possible to reduce the number of production steps.

Further, as shown in FIG. 9I, since the wiring circuit sheet 60 includes the alignment mark metal film 31 having the alignment mark opening portion 33, the inner end edge 40 of the alignment mark metal film 31 can be used as the positioning reference that can be confirmed from both sides of one side and the other side in the thickness direction. Specifically, as shown in FIGS. 9J to 10K, the first photomask 46 and the second photomask 56 can be disposed with the inner end edge 40 as the positioning reference to form the first etching resist opening portion 52 and the second etching resist opening portion 53 by exposure and development.

The applications of the wiring circuit board 1 are also not particularly limited, and can be used in various fields. The wiring circuit board 1 is, for example, used for various applications such as a wiring circuit board for an electronic device (wiring circuit board for an electronic component) and a wiring circuit board for an electrical device (wiring circuit board for an electrical component).

MODIFIED EXAMPLES

In the following modified examples, the same reference numerals are provided for members and steps corresponding to each of those in the above-described second embodiment, and their detailed description is omitted. Further, each of the modified examples can achieve the same function and effect as that of the second embodiment unless otherwise specified. Furthermore, the first embodiment, the second embodiment, and the modified examples can be appropriately used in combination.

In the second embodiment, the wiring circuit board assembly sheet 20 includes the plurality of (specifically, four) alignment marks 21. However, the number thereof is not particularly limited.

Further, the wiring circuit board assembly sheet 20 includes the alignment mark 21. Alternatively, the wiring circuit sheet 60 in the middle of production may include the alignment mark 21 (the inner end edge 40), and though not shown, after the plurality of wiring circuit boards 1 are provided in the wiring circuit board assembly sheet 20, it is also possible to remove the alignment mark 21. That is, in this case, the wiring circuit board assembly sheet 20 does not include the alignment mark 21.

In the second embodiment, as shown in FIGS. 9G to 9I, the second opening portion 41 is formed by etching (wet process). However, for example, though not shown, the second opening portion 41 can be also formed by laser processing (dry process), water jet (water cutter), or press punching. Preferably, etching is used. In the case of the etching, the second opening portion 41 is formed, and the alignment mark metal film 31 can reliably remain.

In the second embodiment, a negative-type photoresist (negative photoresist) is used as the first dry film resist 49 and the second dry film resist 59. Alternatively, for example, it is also possible to use a positive-type photoresist (positive photoresist).

In the second embodiment, the first etching resist 45 and the second etching resist 55 are formed from the first dry film resist 49 and the second dry film resist 59 by photolithography. Alternatively, for example, the first etching resist 45 in which the first etching resist opening portion 52 is formed in advance, and the second etching resist 55 in which the second etching resist opening portion 53 is formed in advance can be also disposed on both sides in the thickness direction of the support metal sheet 42 with the inner end edge 40 as the positioning reference.

The one wiring layer 6 is provided in the one wiring body 24. Alternatively, for example, though not shown, the plurality of wiring layers 6 can be also provided in the one wiring body 24.

In the second embodiment, the plating film 4 which is one example of a protective thin film is formed by plating. Alternatively, for example, the protective thin film (specifically, the resin protective thin film) can be also formed by a wet process other than plating.

Although not shown, for example, the wiring circuit board assembly sheet 20 (ref: FIGS. 7 and 10N) and/or the wiring circuit sheet 60 (ref: FIG. 9I) can also further include the second protective metal film 35, the second base insulating layer 36, the second wiring layer 37, and the second cover insulating layer 38 (ref: FIG. 5 for the above) which are disposed on the other side in the thickness direction of the support metal layer 2. In this case, the entire surface of the support metal layer 2 in the wiring body 24 is protected (covered) by the second protective metal film 35, the protective metal film 3, and the plating film 4.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for a wiring circuit board for an electronic device and a wiring circuit board for an electrical device.

DESCRIPTION OF REFERENCE NUMBER

1 Wiring circuit board
2 Support metal layer
3 Protective metal film
4 Protective thin film
5 Base insulating layer
6 Wiring layer
10 First support surface
11 Second support surface
12 Support side surface
24 Wiring body
31 Alignment mark metal film
33 Alignment mark opening portion
35 Second protective metal film
36 Second base insulating layer
37 Second wiring layer
40 Inner end edge
41 Second opening portion
42 Support metal sheet
43 Metal thin film
45 First etching resist
55 Second etching resist
60 Wiring circuit sheet

The invention claimed is:

1. A wiring circuit comprising:
   a support metal layer having thermal conductivity of 5 W/m·k or more,
   an insulating layer disposed at at least one side in a thickness direction of the support metal layer,
   a wiring layer disposed on a surface of the insulating layer,
   a protective metal film disposed on the entire surface of the support metal layer between the support metal layer and the insulating layer, and
   a protective thin film disposed on an exposed surface exposed from the protective metal film in the support metal layer.

2. The wiring circuit board according to claim 1 comprising:
   a plurality of wiring bodies disposed in parallel at spaced intervals to each other, wherein
   each of the plurality of wiring bodies includes
   the support metal layer,
   the insulating layer,
   the wiring layer,
   the protective metal film, and
   the protective thin film.

3. The wiring circuit board according to claim 1, wherein the protective thin film is a plating film.

4. A method for producing a wiring circuit board producing the wiring circuit hoard according to claim 2 comprising the steps of:
   preparing a support metal sheet having thermal conductivity of 5 W/m·K or more;
   forming a protective metal film, and an alignment mark metal film spaced apart from the protective metal film and having a first opening portion from the same metal thin film on one surface in a thickness direction of the support metal sheet;
   disposing an insulating layer on one surface in the thickness direction of the protective metal film;
   disposing a wiring layer on one surface in the thickness direction of the insulating layer;
   forming a second opening portion in the support metal sheet so as to include a first opening portion when projected in the thickness direction and expose an inner end edge of the first opening portion toward the other side in the thickness direction;
   disposing an etching resist on one surface and the other surface in the thickness direction of the support metal sheet with the inner end edge as a positioning reference so as to have generally the same pattern as a support metal layer when projected in the thickness direction;

forming the support metal layer by etching the support metal sheet exposed from the etching resist from one side and the other side in the thickness direction thereof; and forming the protective thin film on an exposed surface of the support metal layer by a wet process.

5. A wiring circuit sheet for producing the wiring circuit board according to claim 2 comprising:

a support metal sheet having thermal conductivity of 5 W/m·K or more and having a second opening portion;

an insulating layer disposed at at least one side in a thickness direction of the support metal sheet;

a wiring layer;

a protective metal film disposed at spaced intervals to the second opening portion between the insulating layer and the support metal sheet; and an alignment mark metal film disposed on one surface in the thickness direction of the support metal sheet having a first opening portion included in the second opening portion when projected in the thickness direction, and having an inner end edge of the first opening portion exposed toward the other side in the thickness direction through the second opening portion.

* * * * *